(12) United States Patent
Takahashi et al.

(10) Patent No.: US 11,158,630 B2
(45) Date of Patent: Oct. 26, 2021

(54) SEMICONDUCTOR DEVICE

(71) Applicant: Mitsubishi Electric Corporation, Tokyo (JP)

(72) Inventors: Tetsuo Takahashi, Tokyo (JP); Mitsuru Kaneda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 125 days.

(21) Appl. No.: 16/570,708

(22) Filed: Sep. 13, 2019

(65) Prior Publication Data
US 2020/0135717 A1 Apr. 30, 2020

(30) Foreign Application Priority Data

Oct. 30, 2018 (JP) .............................. JP2018-203792

(51) Int. Cl.
*H01L 27/06* (2006.01)
*H01L 29/739* (2006.01)
*H01L 29/861* (2006.01)

(52) U.S. Cl.
CPC ...... *H01L 27/0647* (2013.01); *H01L 29/7393* (2013.01); *H01L 29/861* (2013.01)

(58) Field of Classification Search
CPC ............... H01L 27/0647; H01L 29/861; H01L 29/7393; H01L 29/1095; H01L 29/0834; H01L 27/0727; H01L 29/402; H01L 29/66348; H01L 29/7397; H01L 29/0696; H01L 29/32; H01L 29/407; H01L 29/8613; H01L 29/7396; H01L 29/0603; H01L 29/0684

USPC ......................................................... 257/526
See application file for complete search history.

(56) References Cited

U.S. PATENT DOCUMENTS 5,070,377 A 12/1991 Harada
2019/0259747 A1* 8/2019 Gejo ................... H01L 29/0623

FOREIGN PATENT DOCUMENTS

| JP | H03-238871 A | 10/1991 |
| JP | 3524395 B2 | 5/2004 |
| JP | 2007-115943 A | 5/2007 |
| JP | 2008-192737 A | 8/2008 |

* cited by examiner

*Primary Examiner* — Caleen O Sullivan
(74) *Attorney, Agent, or Firm* — Studebaker & Brackett PC

(57) ABSTRACT

A semiconductor device includes an IGBT as a switching element, and a diode. The IGBT includes: a p type channel doped layer formed in a surface layer part on a front side of a semiconductor substrate; a $p^+$ type diffusion layer and an $n^+$ type source layer individually selectively formed in a surface layer part of the p type channel doped layer; and an emitter electrode connected to the $n^+$ type source layer and the $p^+$ type diffusion layer. A part of the p type channel doped layer reaches a front-side surface of the semiconductor substrate and is connected to the emitter electrode. On the front-side surface of the semiconductor substrate, the $p^+$ type diffusion layer is interposed between the p type channel doped layer and an $n^+$ type source layer, and the p type channel doped layer and the $n^+$ type source layer are not adjacent to each other.

11 Claims, 27 Drawing Sheets

F I G. 1
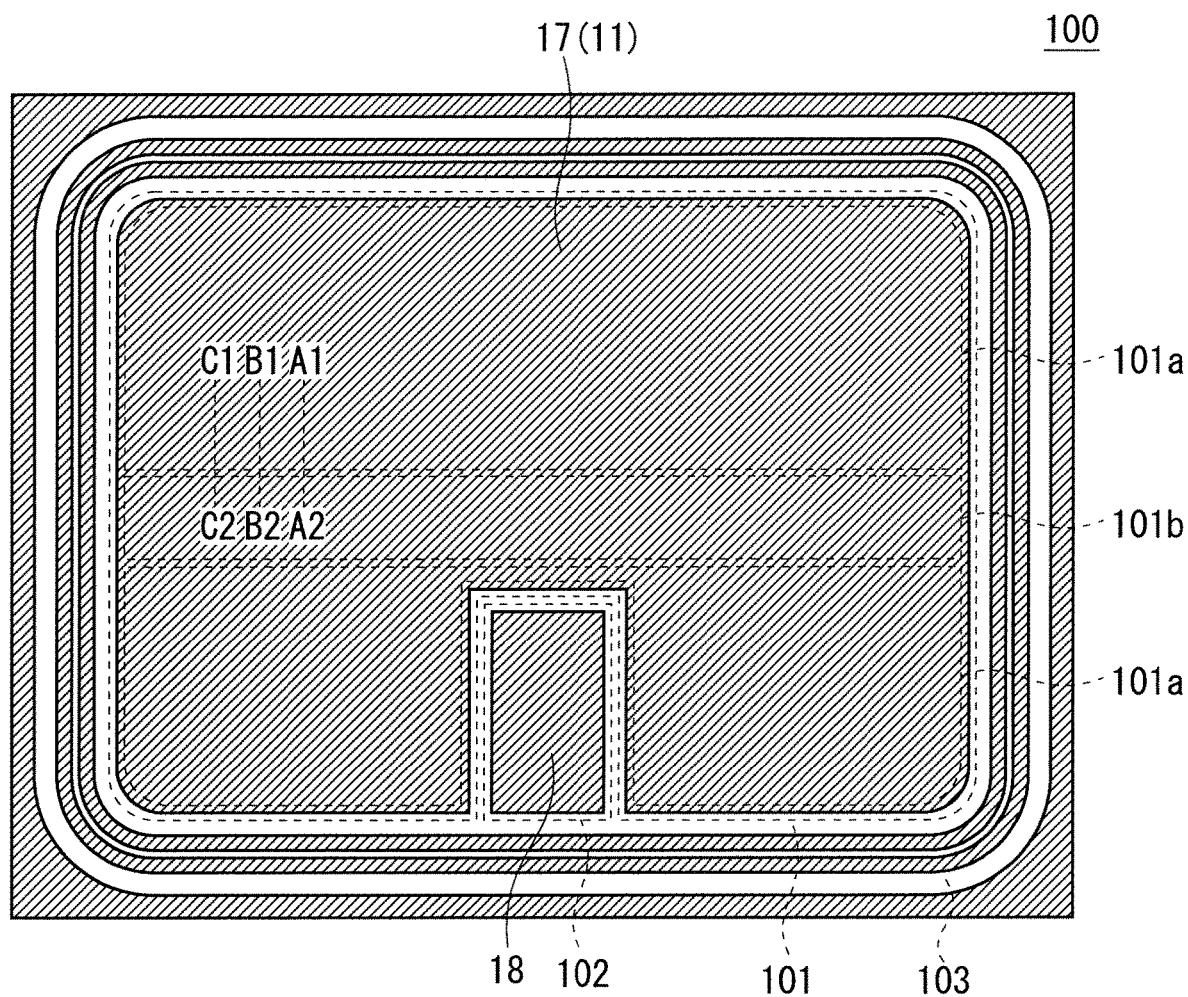

F I G. 4
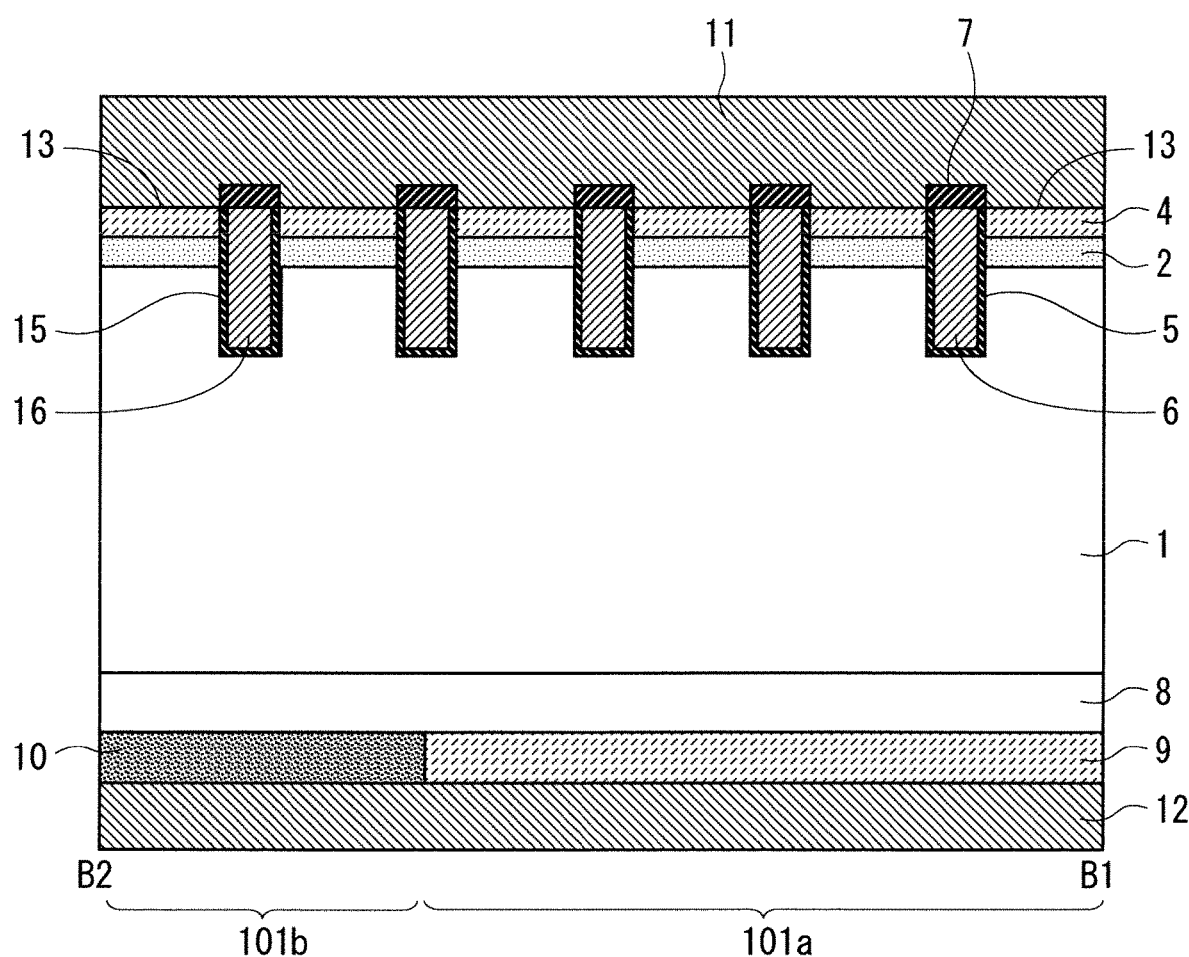

F I G. 6
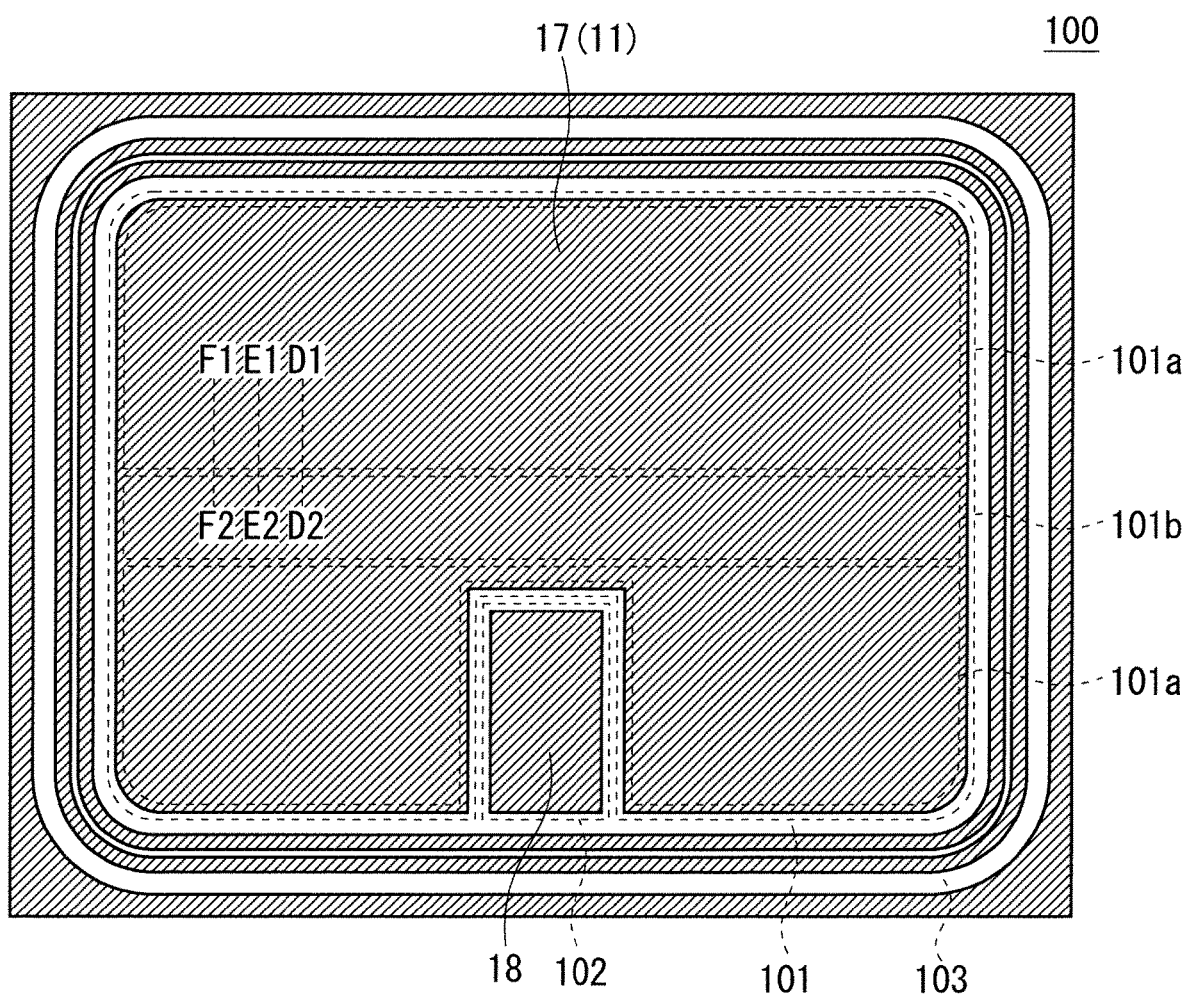

F I G. 7
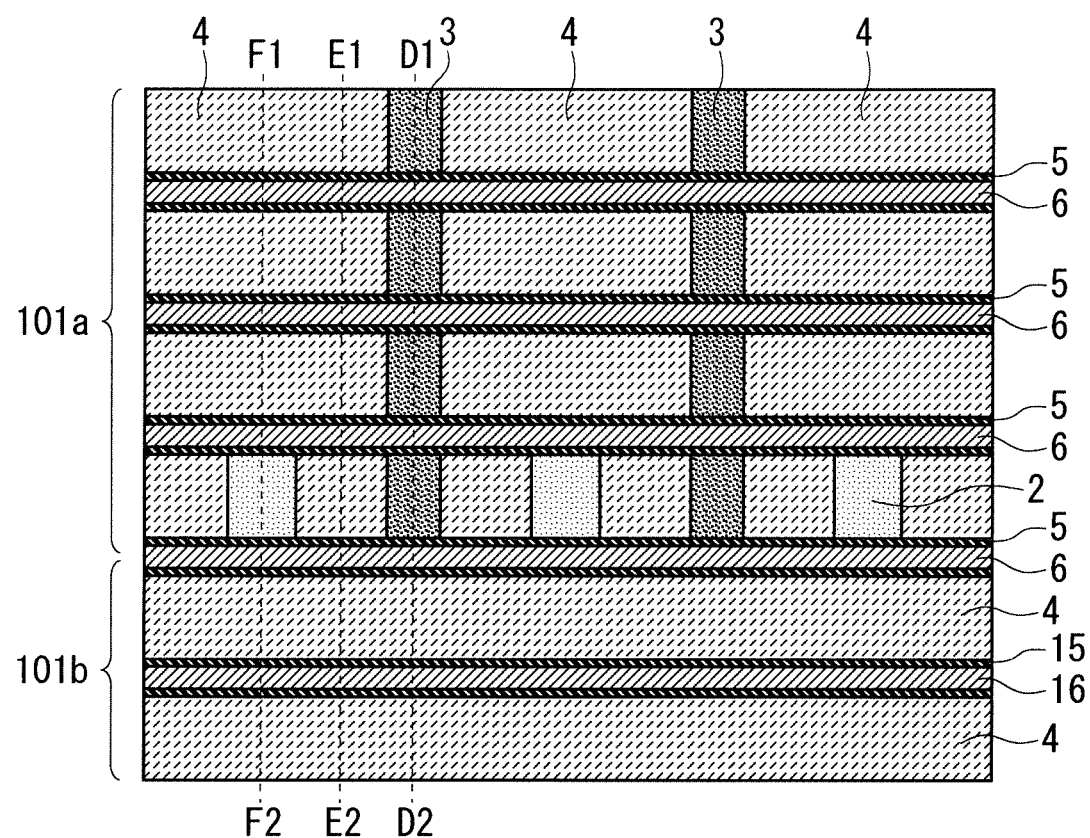

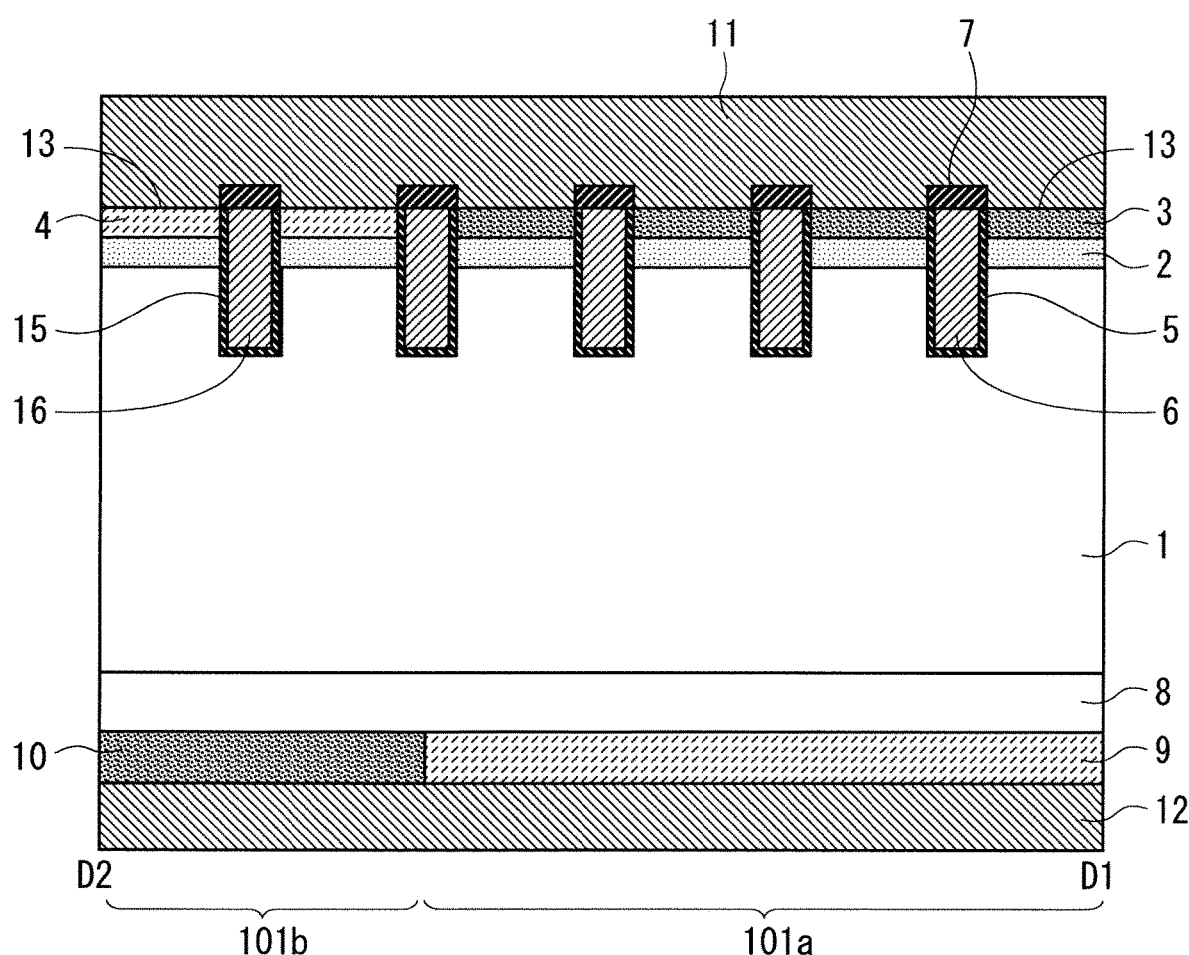
F I G . 8

F I G. 9
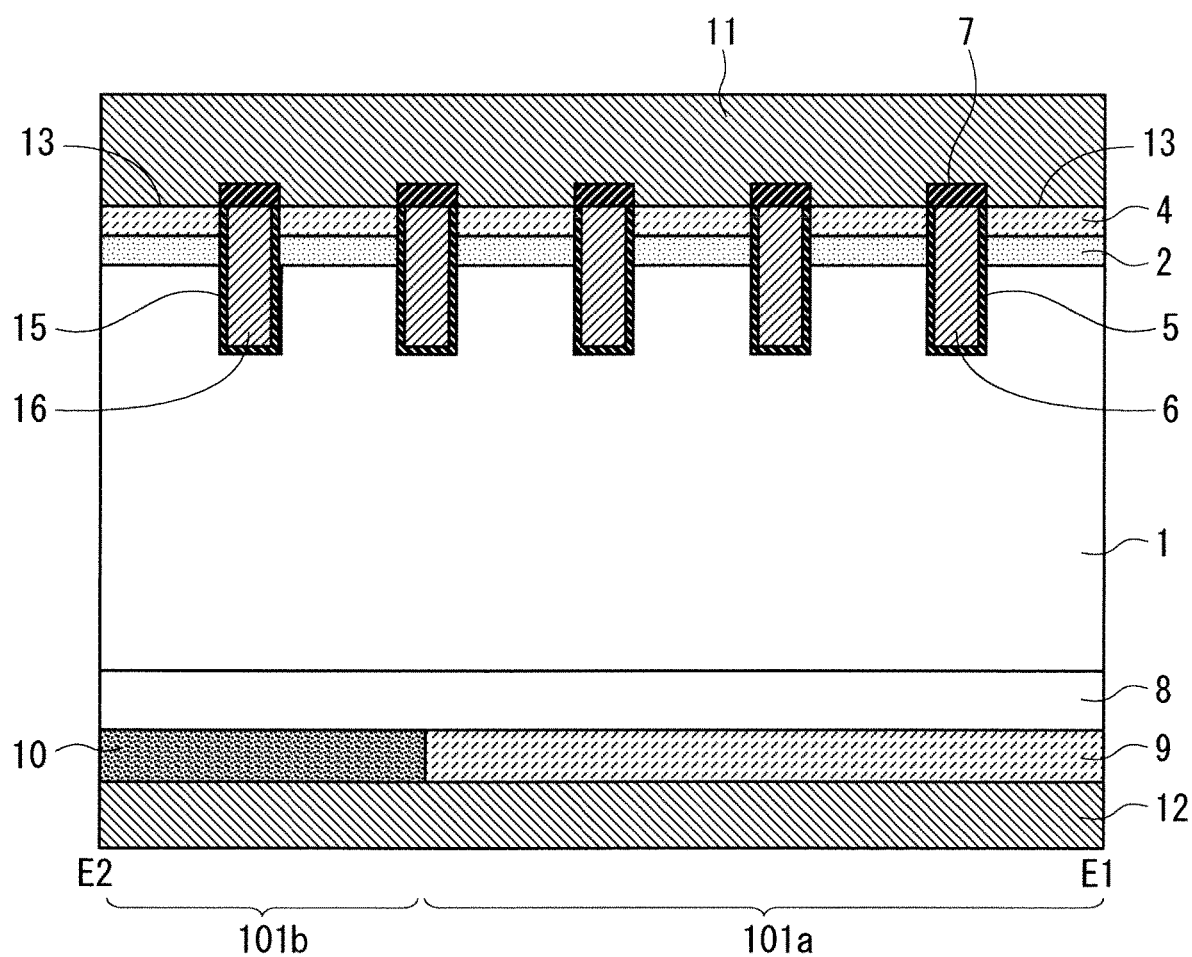

F I G. 1 0
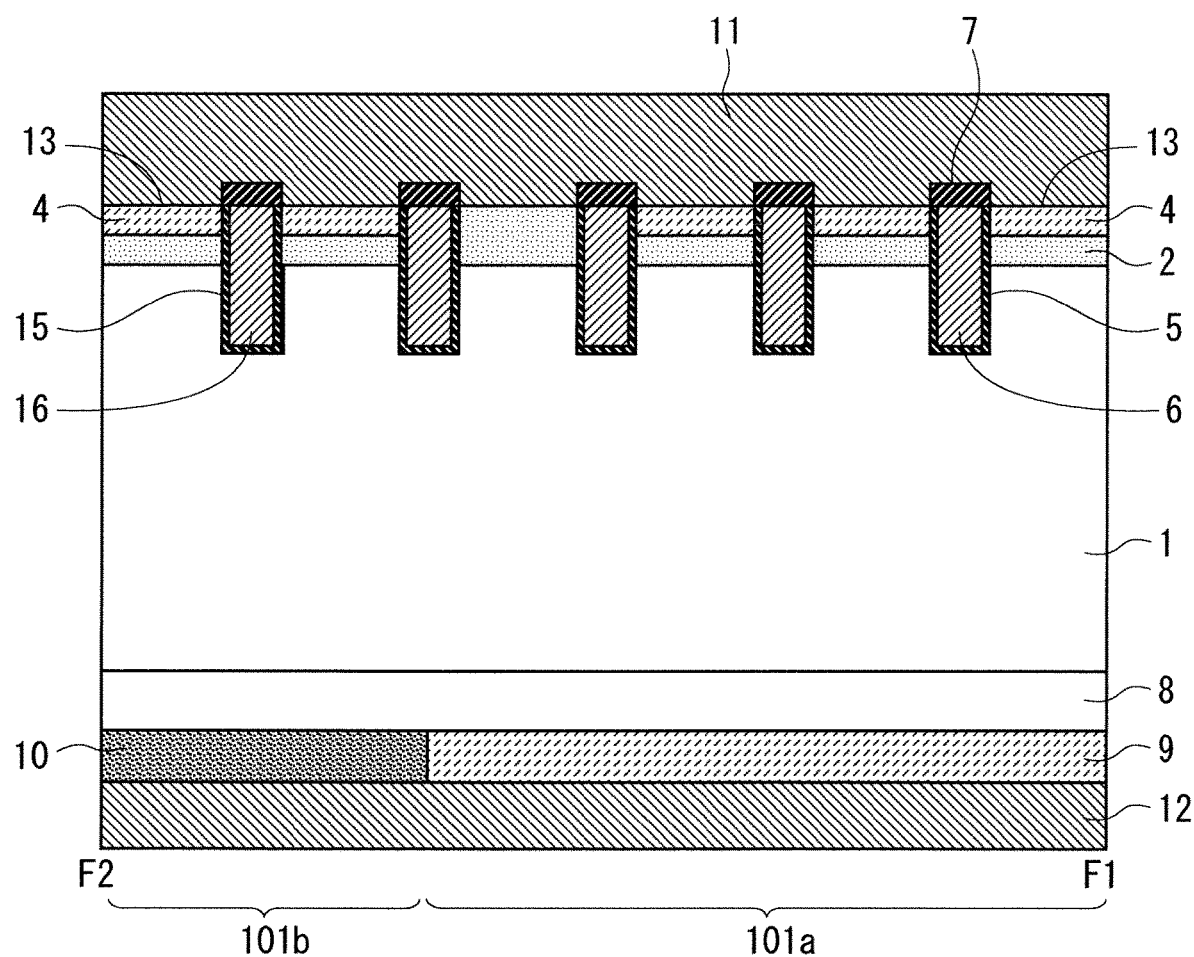

F I G. 1 3
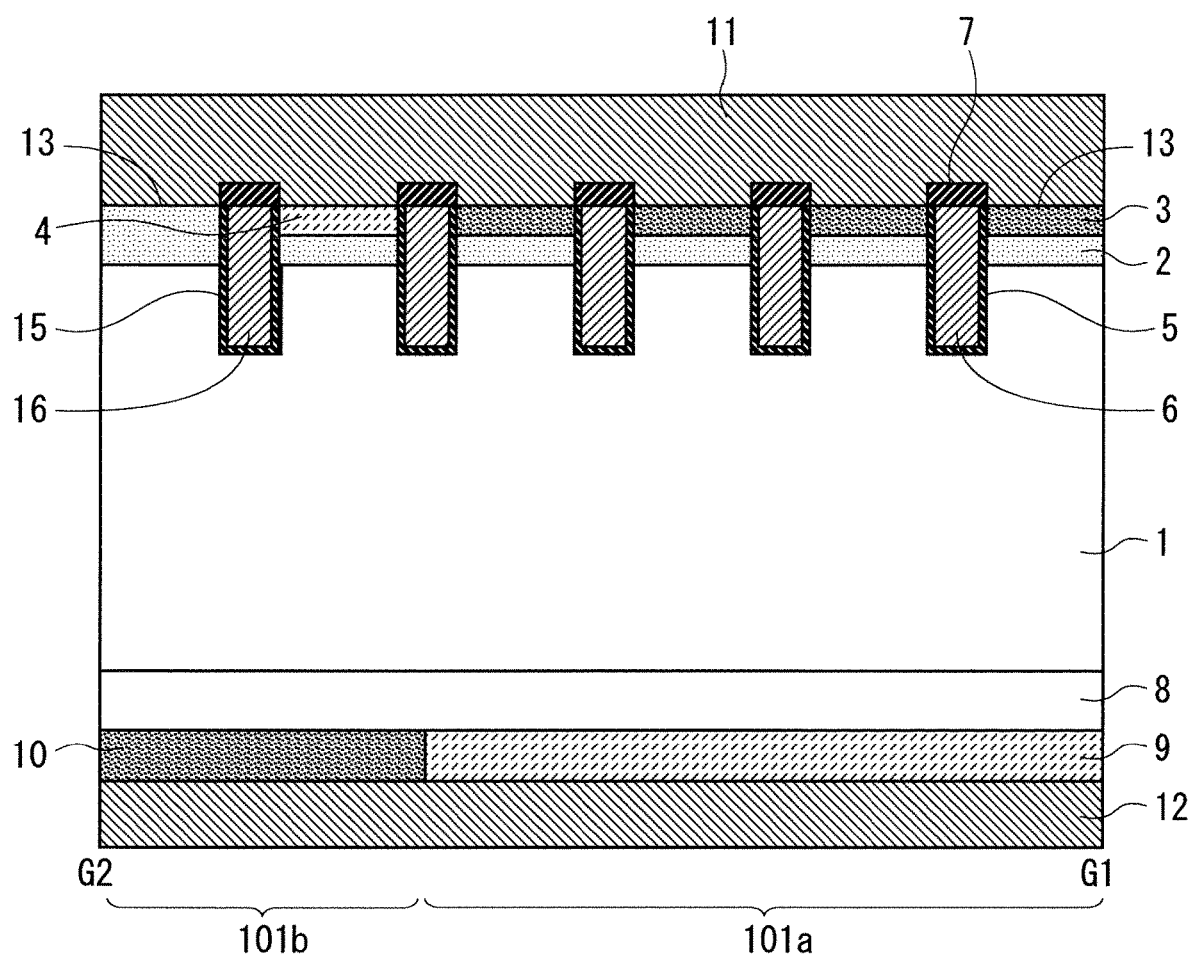

F I G. 1 5
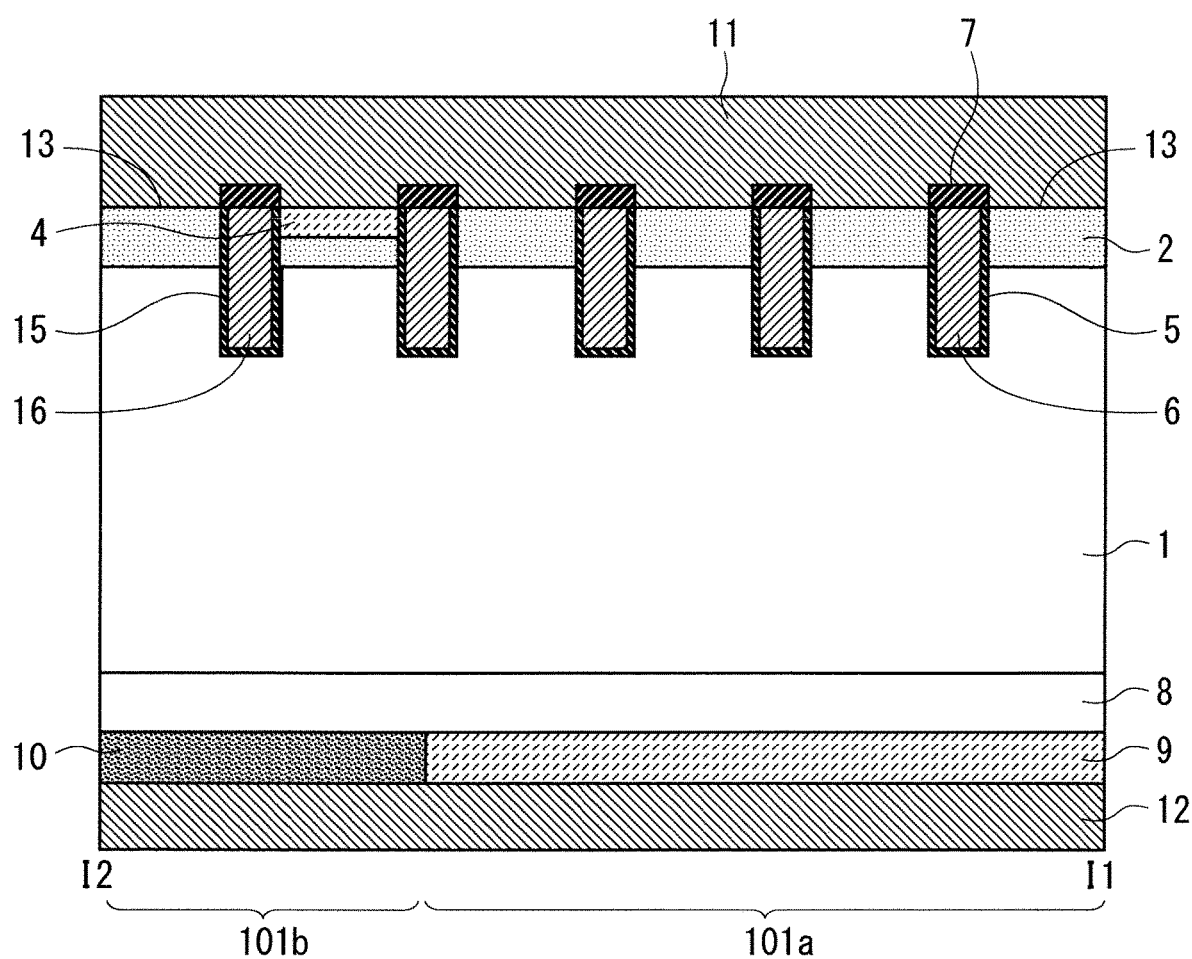

F I G. 1 6
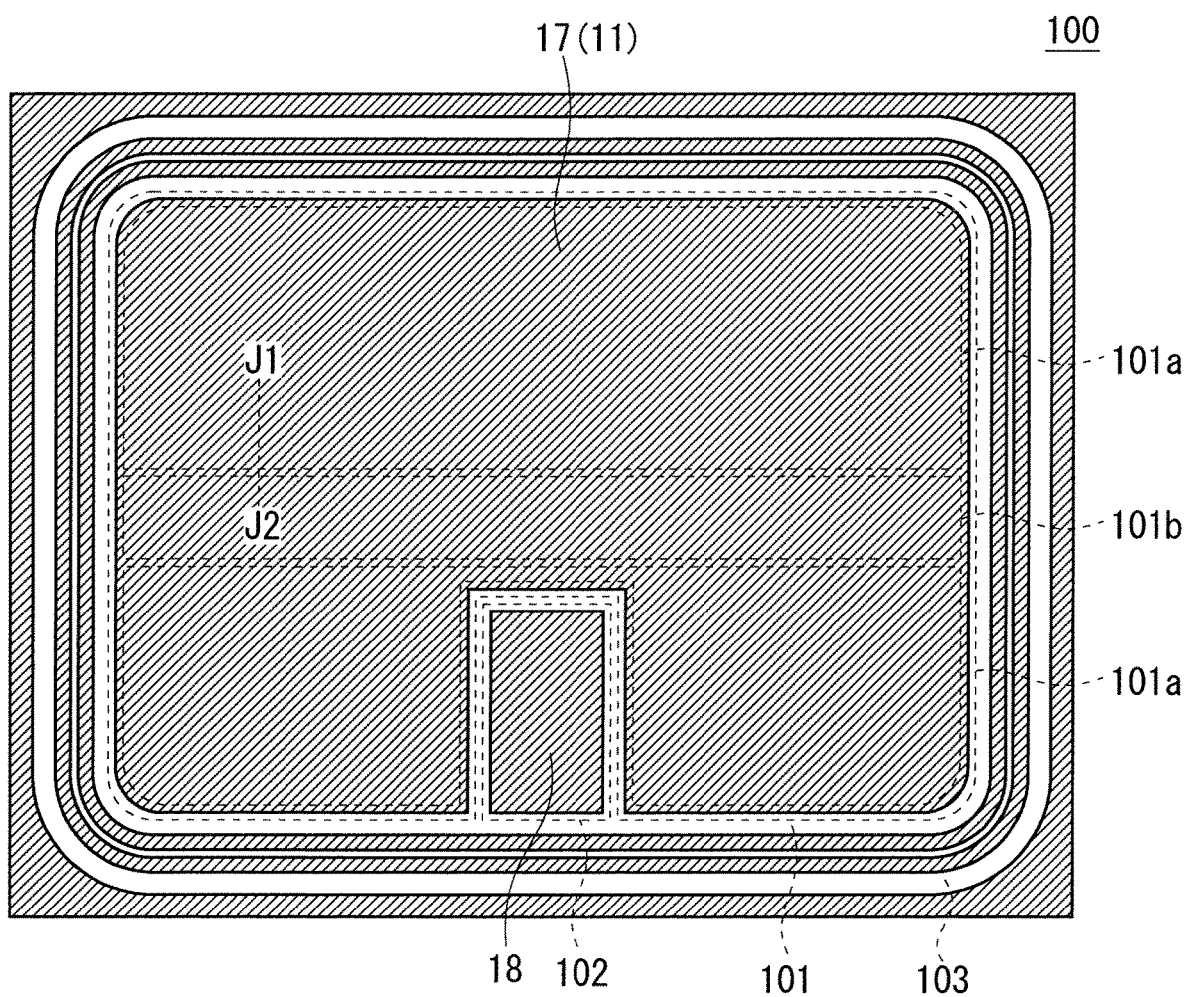

F I G. 1 8
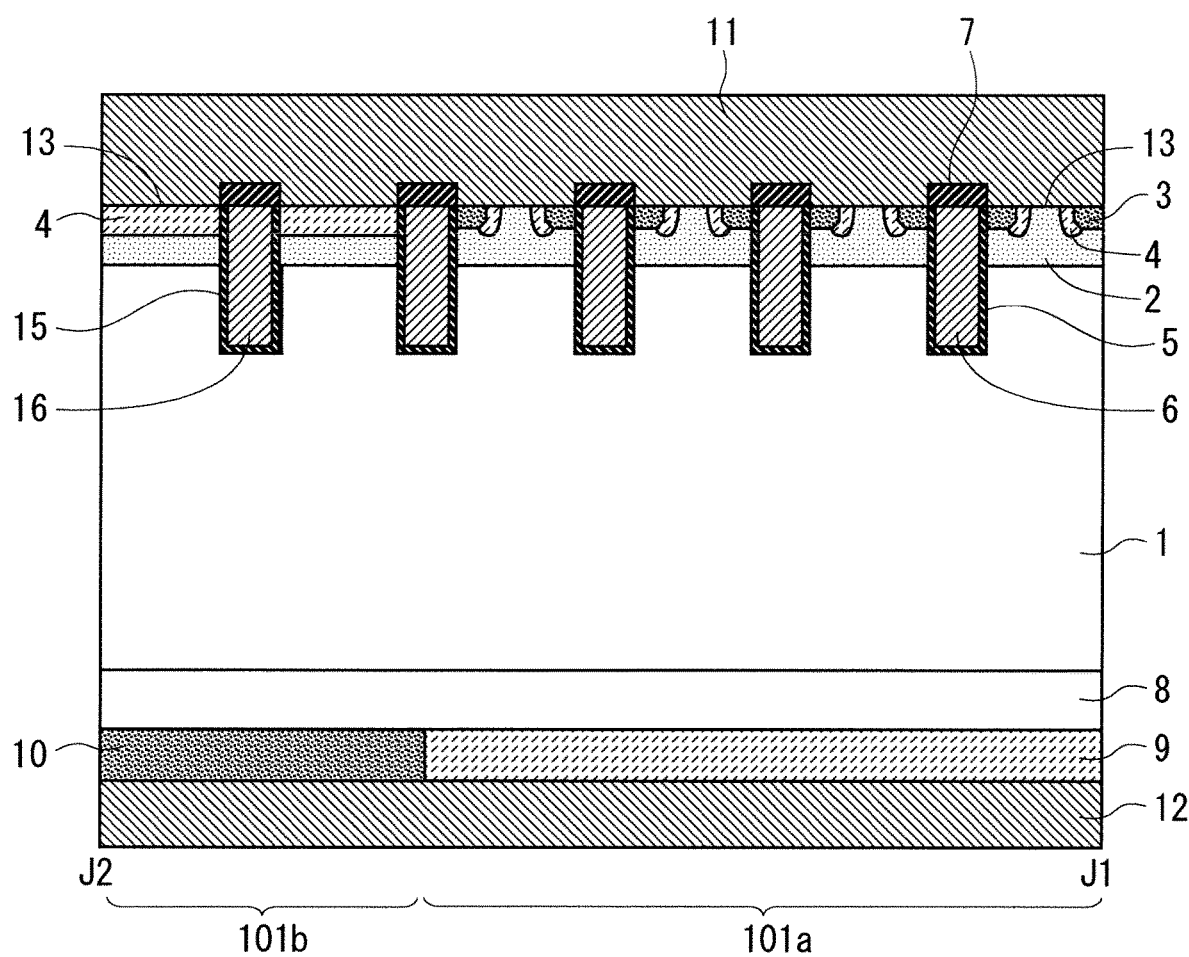

F I G. 1 9
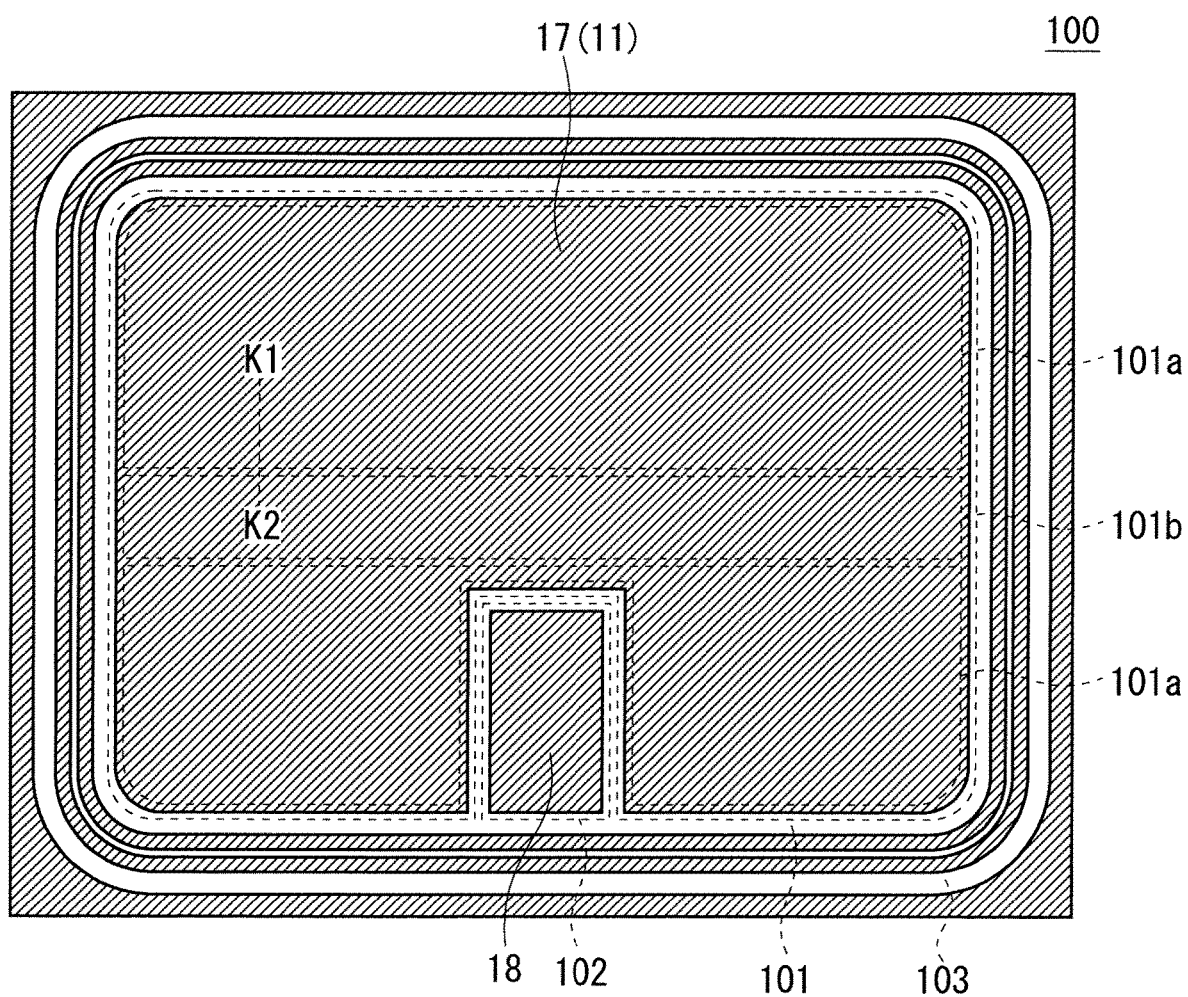

F I G. 2 1
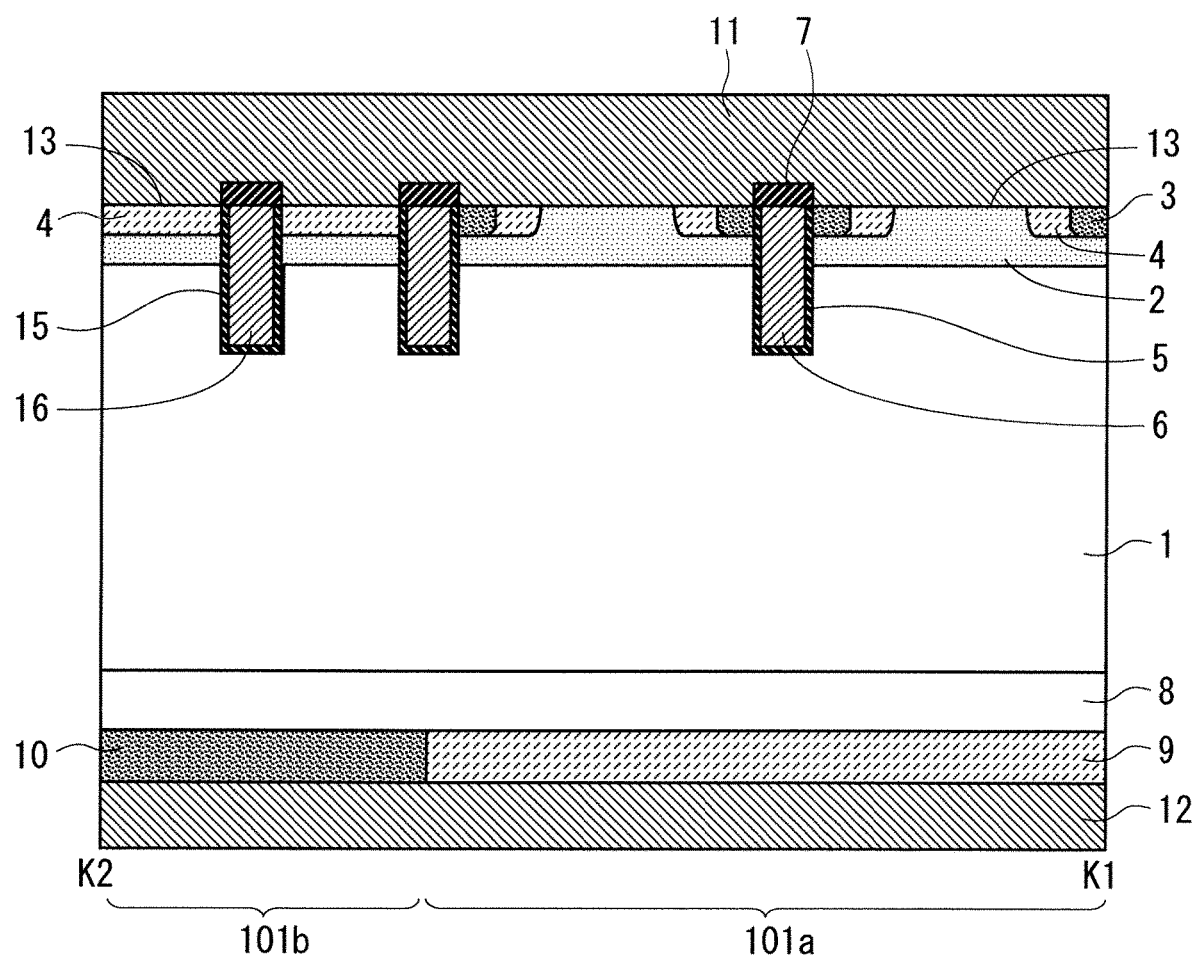

F I G. 2 4
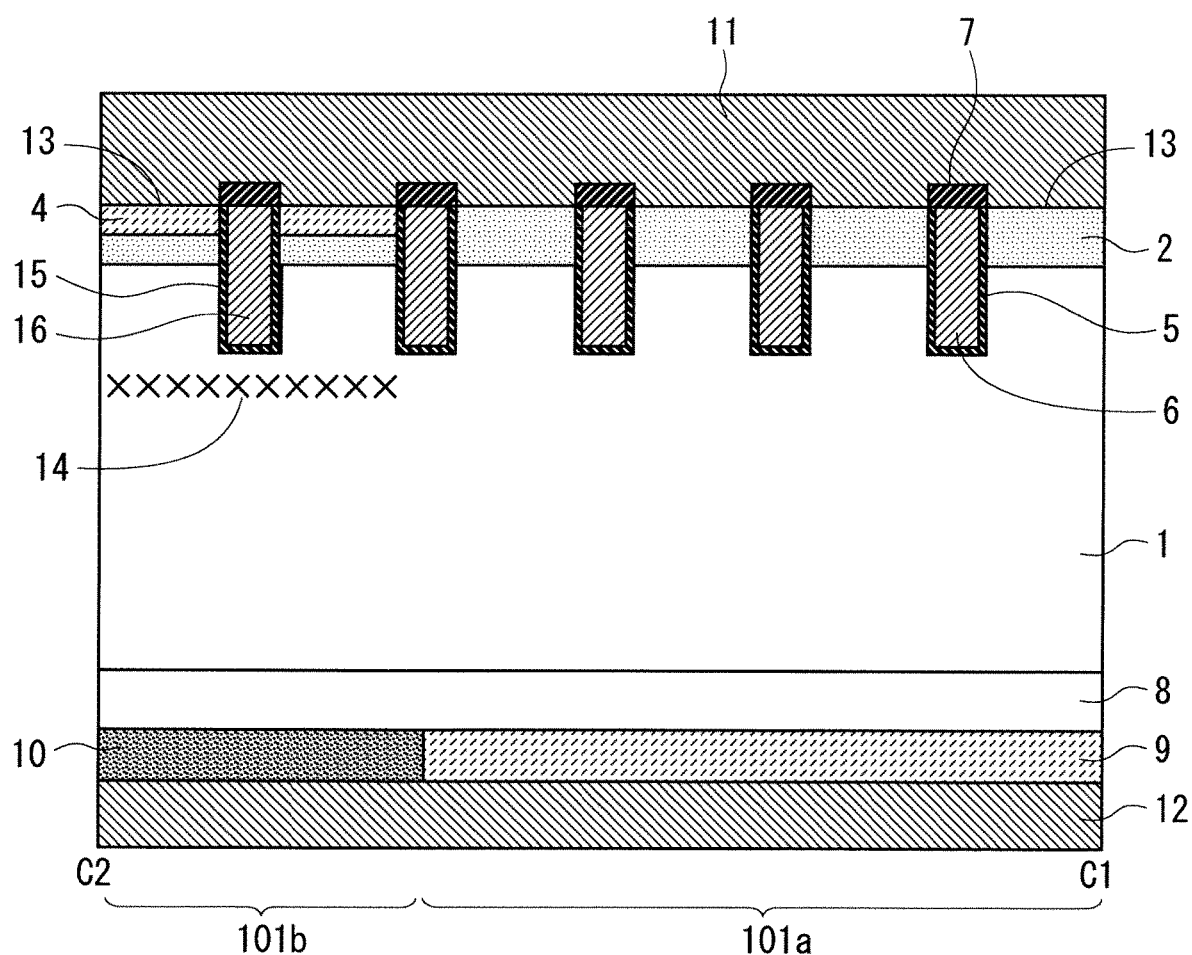

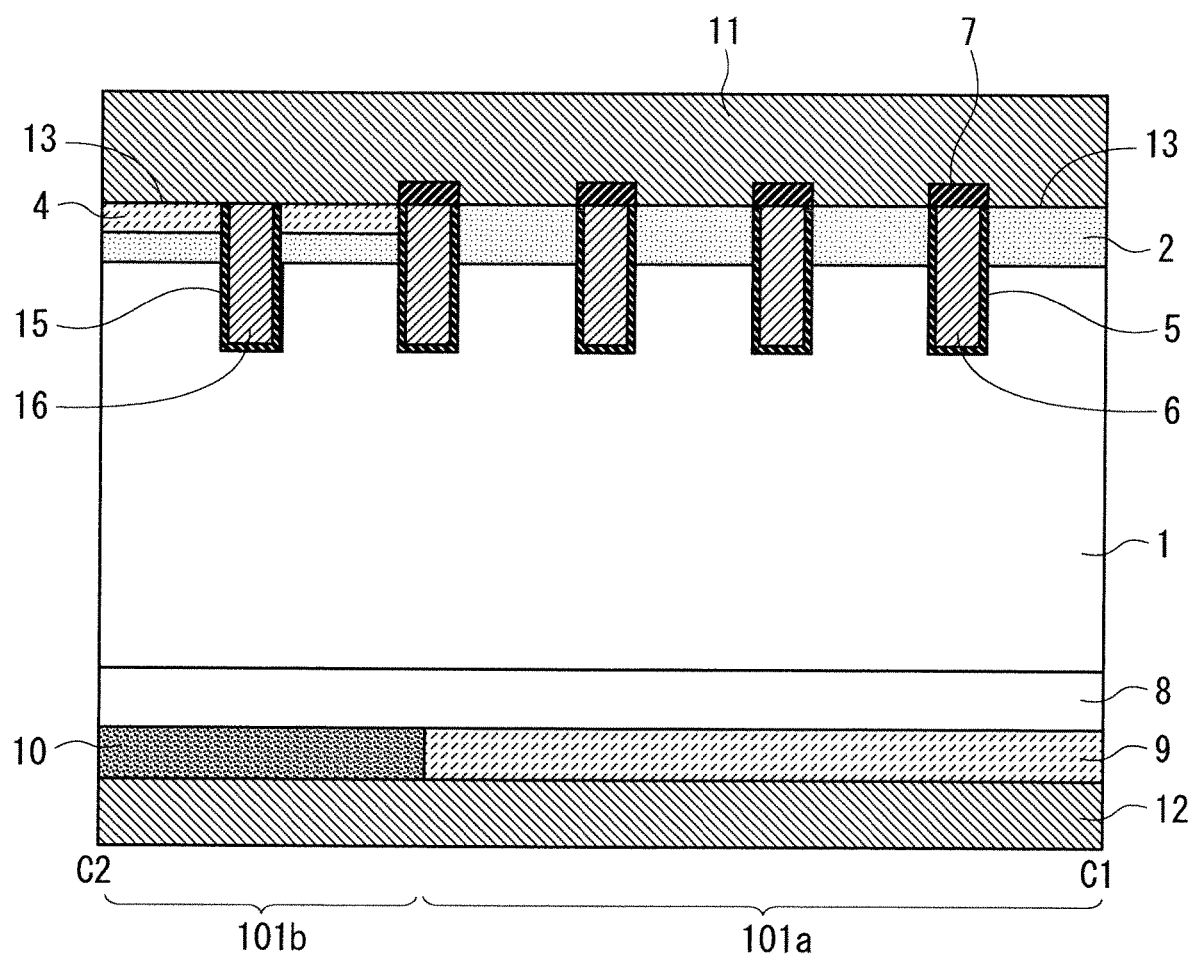
F I G. 2 7

SEMICONDUCTOR DEVICE

BACKGROUND OF THE INVENTION

Field of the Invention

The present invention relates to a semiconductor device, and particularly to a semiconductor device including a switching element and a diode, such as a reverse conducting IGBT.

Description of the Background Art

In general, semiconductor devices (power devices) for power control have various requirements such as breakdown-voltage holding capability and guarantee of a safe operation area (current/voltage area for an element not to be destroyed in operation), and one of the requirements is loss reduction. The loss reduction of power devices has an effect of reducing size and weight of the device, and an effect of accordingly leading to consideration of the global environment by reduction of energy consumption. Furthermore, there is a demand for realizing these characteristics at the lowest possible cost. As one means to respond to such a demand, there has been proposed a reverse-conducting insulated gate bipolar transistor (RC-IGBT) that realizes characteristics of an IGBT and characteristics of a diode functioning as a free wheel diode (FWD), in one chip.

The reverse conducting IGBT has several technical issues, and one of the issues is a large recovery loss in diode operation. In the reverse conducting IGBT, there is a trade-off relation between a part of characteristics in IGBT operation and a part of characteristics in diode operation, which causes such a problem that adopting a structure for reducing recovery loss causes deterioration of other characteristics.

Various techniques for solving this problem have been proposed. For example, Japanese Patent Application Laid-Open No. 3-238871 (1991) proposes a technique for reducing a recovery current of a diode by reducing a depth of an anode region of the diode and reducing an impurity concentration, in a reverse conducting IGBT. However, this technique requires an additional process for forming the anode region, which causes a problem of increased manufacturing cost. Furthermore, since the anode region of the diode and a channel dope region of the IGBT are shared, there is a problem such as deterioration of a reverse bias safe operation area (RBSOA) of the IGBT.

Further, for example, Japanese Patent Application Laid-Open No. 2008-192737 proposes a technique for reducing a recovery current of a diode by providing a damage layer (lifetime control layer) in a diode region. Even with this technique, it is necessary to add a process for forming a damage layer, which causes a problem of increased manufacturing cost. Furthermore, there is also a problem that the effect of the damage layer does not work sufficiently due to a current flow from an IGBT region where the damage layer is not formed.

As described above, the reverse conducting IGBTs of Japanese Patent Application Laid-Open No. 3-238871 (1991) and Japanese Patent Application Laid-Open No. 2008-192737 can reduce recovery loss in diode operation, but in return, problems arise such as decreased tolerance of the IGBT (such as RBSOA tolerance) and increased recovery loss due to an influence of a current from the IGBT region.

SUMMARY

An object of the present invention is to reduce recovery loss in diode operation in a semiconductor device provided with a switching element and a diode, while suppressing reduction in tolerance of the switching element.

A semiconductor device according to the present invention includes a switching element and a diode. The switching element includes: a channel doped layer of a first conductivity type formed in a surface layer part on a front side of a semiconductor substrate; a first diffusion layer of a first conductivity type selectively formed in a surface layer part of the channel doped layer and having a higher impurity concentration than that of the channel doped layer; a source layer of a second conductivity type selectively formed in a surface layer part of the channel doped layer; and an electrode formed on a front-side surface of the semiconductor substrate and connected to the source layer and the first diffusion layer. The diode is formed between the first diffusion layer and a second diffusion layer of a second conductivity type formed in a surface layer part on a back side of the semiconductor substrate. A part of the channel doped layer reaches a front-side surface of the semiconductor substrate and is connected to the electrode. On a front-side surface of the semiconductor substrate, the first diffusion layer is interposed between the channel doped layer and the source layer, and the channel doped layer and the source layer are not adjacent to each other.

According to the present invention, in the switching element, since an area of the first diffusion layer is decreased as the channel doped layer reaching a surface of the semiconductor substrate is formed, and a current flowing into the diode from the first diffusion layer is suppressed, recovery loss of the diode is reduced. Further, on the surface of the semiconductor substrate, since the channel doped layer and the source layer are not adjacent to each other, operation of a parasitic thyristor is suppressed, and reduction in the RBSOA tolerance of the switching element is suppressed.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a plan view of a semiconductor device according to a first preferred embodiment;

FIGS. 3 to 5 each are cross-sectional views of the cell region of the semiconductor device according to the first preferred embodiment;

FIG. 6 is a plan view of a semiconductor device according to a second preferred embodiment;

FIG. 7 is a plan view of a cell region of the semiconductor device according to the second preferred embodiment;

FIGS. 8 to 10 each are cross-sectional views of the cell region of the semiconductor device according to the second preferred embodiment;

FIGS. 13 to 15 each are cross-sectional views of the cell region of the semiconductor device according to the third preferred embodiment;

FIG. 16 is a plan view of a semiconductor device according to a fourth preferred embodiment;

FIG. 18 is a cross-sectional view of the cell region of the semiconductor device according to the fourth preferred embodiment;

FIG. 19 is a plan view of a semiconductor device according to a fifth preferred embodiment;

FIG. 21 is a cross-sectional view of the cell region of the semiconductor device according to the fifth preferred embodiment;

FIGS. 22 to 24 each are cross-sectional views of a cell region of a semiconductor device according to a sixth preferred embodiment; and FIGS. 25 to 27 each are cross-sectional views of a cell region of a semiconductor device according to a seventh preferred embodiment.

DESCRIPTION OF THE PREFERRED EMBODIMENTS

First Preferred Embodiment

Figure 2:
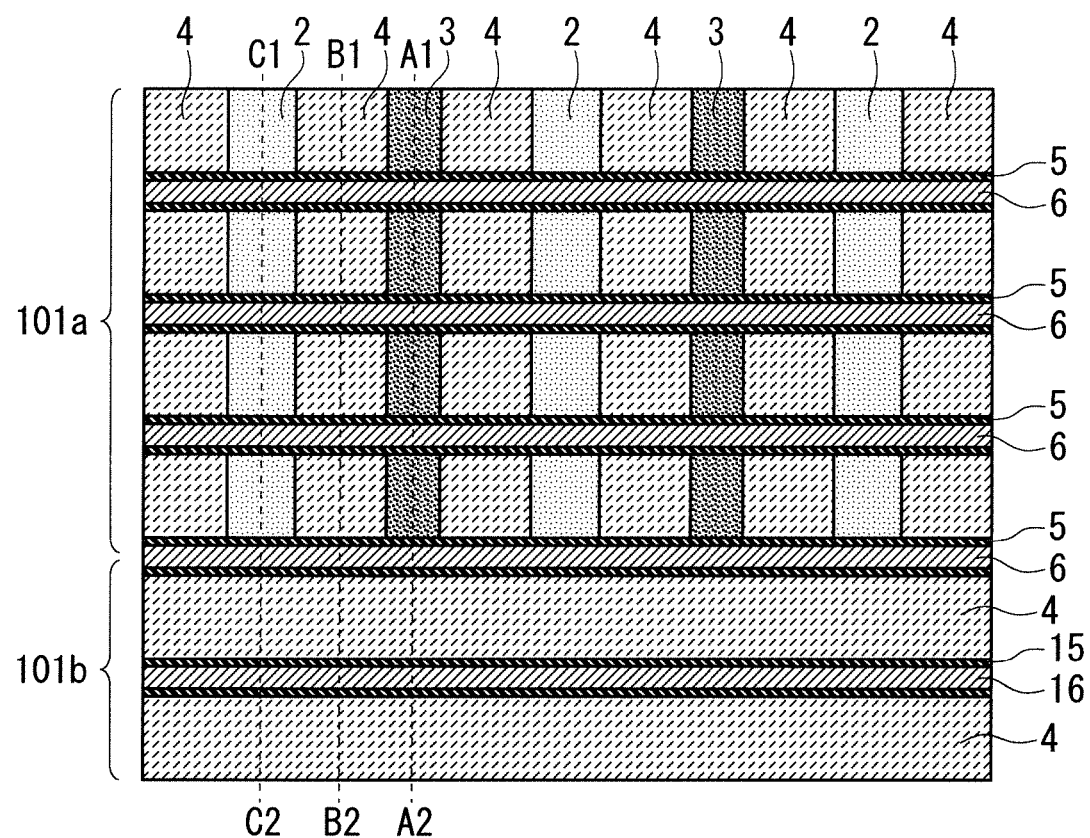
FIG. 2 is a plan view of a cell region of the semiconductor device according to the first preferred embodiment.

FIG. 1 is a plan view of a semiconductor chip of a reverse conducting IGBT, which is a semiconductor device 100 according to a first preferred embodiment. As shown in FIG. 1, the semiconductor device 100 includes: a main electrode region 101 formed with a main electrode 17 of the reverse conducting IGBT; a gate pad region 102 formed with a gate pad 18, which is a control electrode of the reverse conducting IGBT; and a peripheral region 103 formed with a termination structure (for example, a guard ring or the like) of the semiconductor device 100.

Under the main electrode 17, a cell of the IGBT and a cell of the diode configuring the reverse conducting IGBT are formed. That is, the main electrode region 101 is a cell region formed with the IGBT cell and the diode cell (hereinafter, the main electrode region 101 may also be referred to as a "cell region").

As shown in FIG. 1, the main electrode region 101 is divided into an IGBT region 101a, which is a formation region of an IGBT cell, and a diode region 101b, which is a formation region of a diode cell. That is, the IGBT region 101a and the diode region 101b are block-shaped regions segmented from each other in plan view.

FIG. 2 is an enlarged plan view of a boundary portion between the IGBT region 101a and the diode region 101b in the cell region (main electrode region 101) of the semiconductor device 100, and shows a configuration of a surface of the semiconductor substrate. That is, in FIG. 2, the main electrode 17 and the like formed on the semiconductor substrate are not illustrated. Further, FIGS. 3 to 5 are cross-sectional views of the cell region of the semiconductor device 100, in which FIG. 3 corresponds to the cross section along line A1-A2 of FIG. 2, FIG. 4 corresponds to the cross section along line B1-B2 of FIG. 2, and FIG. 5 corresponds to the cross section along line C1-C2 of FIG. 2.

Figure 3:
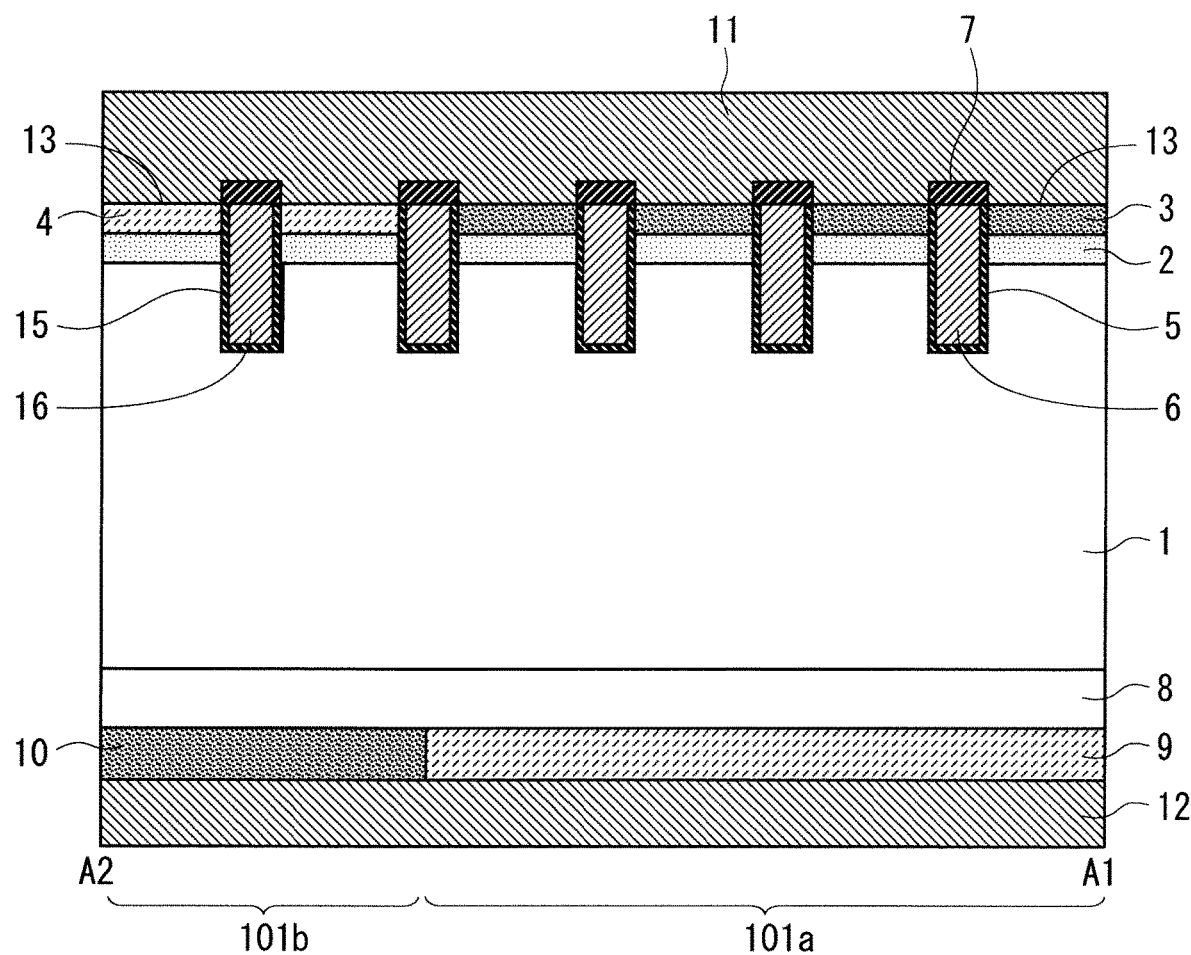
Figure 5:
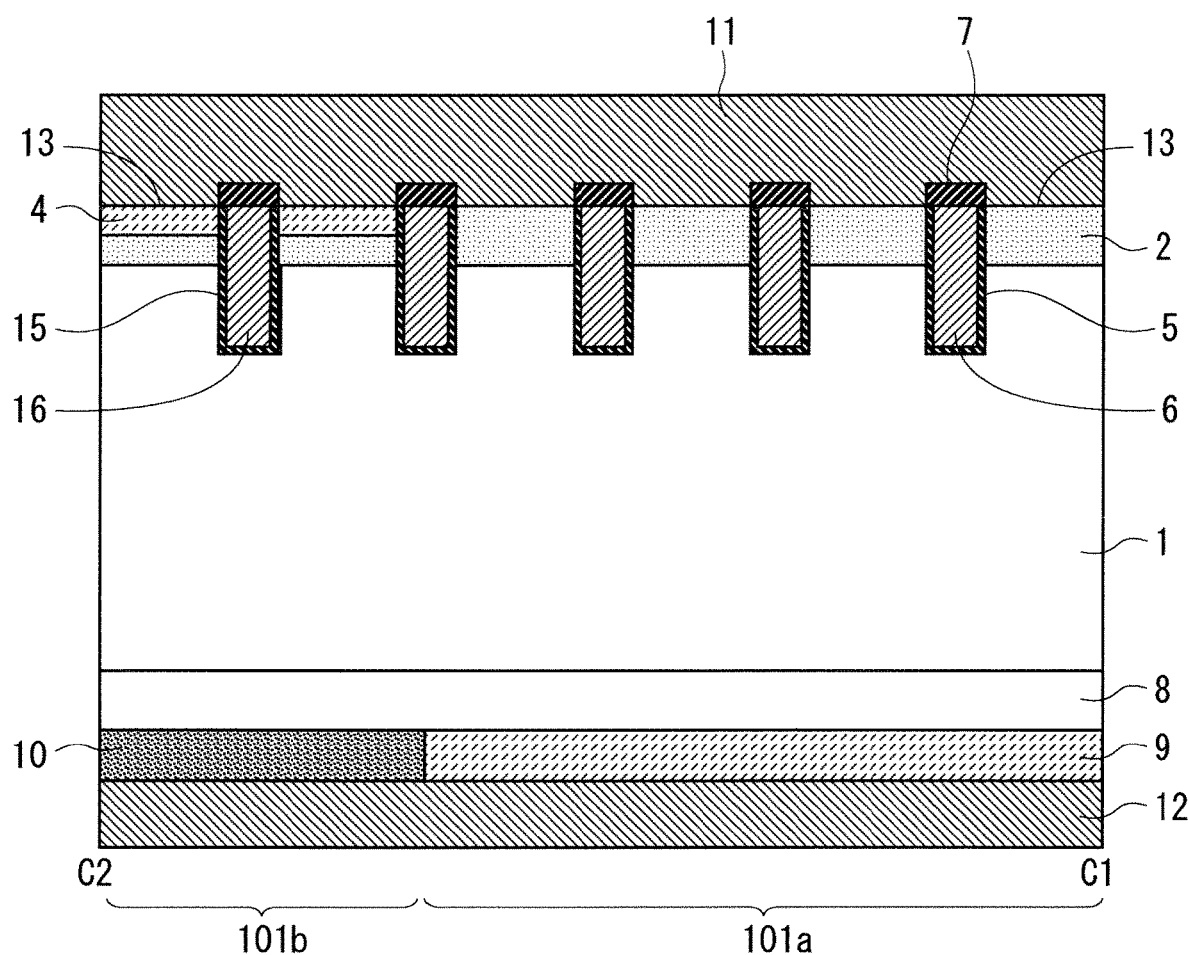

As shown in FIGS. 3 to 5, the semiconductor device 100 includes an n⁻ type drift layer 1 of a second conductivity type (n type) formed in the semiconductor substrate, and a p type channel doped layer 2 of a first conductivity type (p type) formed in a surface layer part on a front side (upper side in FIGS. 3 to 5) of the semiconductor substrate. The n⁻ type drift layer 1 and the p type channel doped layer 2 are formed across the IGBT region 101a and the diode region 101b, and the n⁻ type drift layer 1 is formed below the p type channel doped layer 2.

In a surface layer part of the p type channel doped layer 2, there are individually selectively formed an n⁺ type source layer 3 of a second conductivity type having a higher impurity concentration than that of the n⁻ type drift layer 1, and a p⁺ type diffusion layer 4, which is a first diffusion layer of a first conductivity type, having a higher impurity concentration than that of the p type channel doped layer 2.

The n⁺ type source layer 3 is formed in the IGBT region 101a, and the p⁺ type diffusion layer 4 is formed in both the IGBT region 101a and the diode region 101b. Further, as shown in FIG. 5, in the IGBT region 101a, there is a portion where neither the n⁺ type source layer 3 nor the p⁺ type diffusion layer 4 is formed, and, in that portion, the p type channel doped layer 2 reaches the front-side surface of the semiconductor substrate. Here, as shown in FIG. 2, on the front-side surface of the semiconductor substrate, the p⁺ type diffusion layer 4 is interposed between the p type channel doped layer 2 and the n⁺ type source layer 3, and the p type channel doped layer 2 and the n⁺ type source layer 3 are configured not to be adjacent to each other.

On the front side of the semiconductor substrate, a trench reaching the n⁻ type drift layer 1 is formed. On an inner wall and a bottom of the trench, a gate insulating film 5 is formed, and a gate electrode 6 buried in the trench is formed on the gate insulating film 5. Further, on the gate insulating film 5, a cap insulating film 7 is formed.

As shown in FIG. 3, in the IGBT region 101a, the trench in which the gate insulating film 5 is buried is arranged adjacent to the n⁺ type source layer 3 and the p type channel doped layer 2 under the n⁺ type source layer 3. That is, the n⁺ type source layer 3 and the p type channel doped layer 2 under the n⁺ type source layer 3 are adjacent to the gate electrode 6 via the gate insulating film 5. In ON operation of the IGBT, in a portion of the p type channel doped layer 2 adjacent to the gate electrode 6, a channel serving as a current path between the n⁻ type drift layer 1 and the n⁺ type source layer 3 is formed.

As shown in FIG. 2, the gate electrodes 6 are arranged in a stripe shape. That is, a plurality of gate electrodes 6 are provided, and they extend in one direction and are arranged in parallel to each other. The IGBT region 101a is divided into a plurality of IGBT cells by the plurality of gate electrodes 6.

Note that, in the first preferred embodiment, a buried insulating film 15 and a buried electrode 16 having configurations similar to those of the gate insulating film 5 and the gate electrode 6 are also formed in the diode region 101b. The diode region 101b is divided into a plurality of diode cells by the buried electrode 16. Since the buried electrode 16 is not adjacent to the n⁺ type source layer 3, the buried electrode 16 does not function as a gate electrode for controlling ON/OFF of the IGBT.

Whereas, under the n⁻ type drift layer 1, an n type buffer layer 8 of a second conductivity type is formed across the IGBT region 101a and the diode region 101b.

Furthermore, in a surface layer part on a back side (lower side in FIGS. 3 to 5) of the semiconductor substrate, that is, in the surface layer part of the n type buffer layer 8, a p⁺ type collector layer 9 of a first conductivity type is formed in the IGBT region 101a, and an n⁺ type cathode layer 10, which is a second diffusion layer of a second conductivity type, is formed in the diode region 101b.

By the n⁻ type drift layer 1, the p type channel doped layer 2, the n⁺ type source layer 3, the p⁺ type diffusion layer 4, the gate insulating film 5, the gate electrode 6, the n type buffer layer 8, and the p⁺ type collector layer 9 that are formed in the IGBT region 101a, the IGBT as a switching element is configured. In addition, by the n⁻ type drift layer 1, the p type channel doped layer 2, the p⁺ type diffusion layer 4, the n type buffer layer 8, and the n⁺ type cathode layer 10 that are formed in the diode region 101b, the diode is configured. That is, the diode is formed between the p⁺ type diffusion layer 4 functioning as an anode layer, and the n⁺ type cathode layer 10.

On the front-side surface of the semiconductor substrate, an emitter electrode 11 of the IGBT is formed. The emitter electrode 11 is formed across the IGBT region 101a and the diode region 101b, and connected not only to the n⁺ type source layer 3 and the p⁺ type diffusion layer 4 of the IGBT region 101a, but also to the p⁺ type diffusion layer 4 of the diode region 101b. Thus, the emitter electrode 11 also functions as an anode electrode of the diode. As described above, a portion of the p type channel doped layer 2 of the IGBT region 101a reaches the front-side surface of the semiconductor substrate, and as shown in FIG. 5, the portion of the p type channel doped layer 2 reaching the semiconductor substrate surface is connected to the emitter electrode 11.

On a surface on a back side of the semiconductor substrate, a collector electrode 12 of the IGBT is formed. The collector electrode 12 is formed across the IGBT region 101a and the diode region 101b, and connected not only to the p⁺ type collector layer 9 of the IGBT region 101a, but also to the n⁺ type cathode layer 10 of the diode region 101b. Thus, the collector electrode 12 also functions as a cathode electrode of the diode.

Note that the emitter electrode 11 is to be the main electrode 17 shown in FIG. 1. Further, the gate electrode 6 is connected to the gate pad 18 shown in FIG. 1 in a region not shown.

When the semiconductor device 100 operates as an IGBT (hereinafter referred to as "in IGBT operation"), in the IGBT region 101a, a channel is formed in the p type channel doped layer 2 adjacent to the gate electrode 6, and electrical conduction is established between the n⁻ type drift layer 1 and the n⁺ type source layer 3. Therefore, a current flows from the collector electrode 12 to the emitter electrode 11 via the p⁺ type collector layer 9, the n type buffer layer 8, the n⁻ type drift layer 1, the p type channel doped layer 2 (channel region), and the n⁺ type source layer 3.

Further, when the semiconductor device 100 operates as a diode (hereinafter referred to as "in diode operation"), the p type channel doped layer 2 and the p⁺ type diffusion layer 4 of the diode region 101b function as an anode of the diode, and a current flows from the emitter electrode 11 to the collector electrode 12 via the p⁺ type diffusion layer 4, the p type channel doped layer 2, the n⁻ type drift layer 1, the n type buffer layer 8, and the n⁺ type cathode layer 10.

Thus, the semiconductor device 100 functions as a reverse conducting IGBT capable of realizing both the operation as the IGBT and the operation as the diode connected in antiparallel to the IGBT.

Note that, in the present preferred embodiment, the semiconductor substrate is formed of silicon (Si), the gate insulating film 5 and the cap insulating film 7 are formed of a silicon oxide film (SiO₂), the gate electrode 6 and the buried electrode 16 are formed of N-type polysilicon, and the emitter electrode 11 and the collector electrode 12 are formed of a metal containing aluminum.

Next, features of the semiconductor device 100 according to the first preferred embodiment and effects obtained thereby will be described. In the following description, a connection portion between the emitter electrode 11 and the semiconductor substrate, that is, a portion in contact with the emitter electrode 11 on the surface of the semiconductor substrate is referred to as a "contact part". A contact part 13 shown in FIGS. 3 to 5 indicates the entire connection portion between the emitter electrode 11 and the semiconductor substrate. That is, the contact part 13 includes both a connection portion between the emitter electrode 11 and the semiconductor substrate of the IGBT region 101a, and a connection portion between the emitter electrode 11 and the semiconductor substrate of the diode region 101b. Further, the contact part 13 includes any of: a connection portion between the emitter electrode 11 and the p type channel doped layer 2; a connection portion between the emitter electrode 11 and the n⁺ type source layer 3; and a connection portion between the emitter electrode 11 and the p⁺ type diffusion layer 4.

In the semiconductor device 100 according to the first preferred embodiment, in the IGBT region 101a, a part of the p type channel doped layer 2 reaches the contact part 13 as shown in FIG. 5, and, in the contact part 13, the p⁺ type diffusion layer 4 is interposed between the p type channel doped layer 2 and the n⁺ type source layer 3 as shown in FIG. 2 such that the p type channel doped layer 2 and the n⁺ type source layer 3 are not adjacent to each other. Further, in the contact part 13, the p⁺ type diffusion layer 4 interposed between the p type channel doped layer 2 and the n⁺ type source layer 3 includes a portion having the highest impurity concentration of a first conductivity type (p type).

Furthermore, a thickness (a depth from the front-side surface of the semiconductor substrate) and an impurity concentration of the p type channel doped layer 2 are uniform across the IGBT region 101a and the diode region 101b, and further, a thickness and an impurity concentration of the p⁺ type diffusion layer 4 are also uniform across the IGBT region 101a and the diode region 101b.

Such a structure can be formed by changing a pattern of a transfer mask for forming the n⁺ type source layer 3 or the p⁺ type diffusion layer 4, in a manufacturing method of a general reverse conducting IGBT (a structure in which the n⁺ type source layer 3 or the p⁺ type diffusion layer 4 is formed on the entire surface layer part of the p type channel doped layer 2, and the p type channel doped layer 2 does not reach the contact part 13). That is, the reverse conducting IGBT according to the first preferred embodiment can be formed without adding a new step to a manufacturing method of a general reverse conducting IGBT, and an increase in the manufacturing cost can be suppressed.

In diode operation of the semiconductor device 100, a main current flows by injection of a positive hole from the p⁺ type diffusion layer 4 of the diode region 101b. However, when a large number of the positive holes are injected also from a parasitic diode formed by the p⁺ type diffusion layer 4 of the IGBT region 101a located in the vicinity thereof, this causes an increase in recovery loss. In the semiconductor device 100 according to the first preferred embodiment, since the p type channel doped layer 2 reaching the surface of the semiconductor substrate is formed in the IGBT region 101a, an area of the p⁺ type diffusion layer 4 formed in the IGBT region 101a is small as compared with that of a general reverse conducting IGBT. Therefore, the influence of parasitic diode is suppressed, and recovery loss is reduced.

Further, in the semiconductor device 100 of the first preferred embodiment, the p type channel doped layer 2 having a lower impurity concentration than that of the p⁺ type diffusion layer 4 is connected to the emitter electrode 11 in a part of the IGBT region 101a. For example, in a case where a contact resistance between the p type region of the IGBT region 101a and the emitter electrode 11 is high, a problem arises that a controllable current of the IGBT decreases due to operation of a parasitic thyristor formed by the n$^+$ type source layer 3, the p type channel doped layer 2, the n$^-$ type drift layer 1, and the p type collector layer 9 in IGBT operation of the semiconductor device 100, and the RBSOA decreases (the RBSOA tolerance decreases). In the semiconductor device of the first preferred embodiment, in the contact part 13, the p$^+$ type diffusion layer 4 having a high impurity concentration is arranged immediately next to the n$^+$ type source layer 3, and the p type channel doped layer 2 having a relatively high contact resistance with the emitter electrode 11 is configured not to be adjacent to the n$^+$ type source layer 3. With this configuration, it is possible to inhibit operation of the parasitic thyristor and to suppress reduction in the RBSOA tolerance.

Meanwhile, a width of the p$^+$ type diffusion layer 4 is desirably set in consideration of a diffusion distance of impurities. The p$^+$ type diffusion layer 4 is formed by selectively implanting p type impurities into the semiconductor substrate by ion implantation using a mask formed by a photolithographic technology, and further performing heat treatment to diffuse the impurities to a required depth. At an end part of the impurity-implanted region, the impurity diffuses not only in a depth direction but also in a lateral direction. Usually, the diffusion distance in the lateral direction is about 0.7 to 0.8 times the diffusion distance in the depth direction. Therefore, in order to form a width of the p$^+$ type diffusion layer 4 properly, it is desirable to design the width of the p$^+$ type diffusion layer 4 to be 70% or more of a junction depth of the p$^+$ type diffusion layer 4.

As described above, according to the semiconductor device 100 according to the first preferred embodiment, it is possible to reduce the recovery loss in diode operation while suppressing reduction in the tolerance of the IGBT and the increase in the number of manufacturing steps.

Second Preferred Embodiment

FIG. 6 is a plan view of a semiconductor chip of a reverse conducting IGBT, which is a semiconductor device 100 according to a second preferred embodiment. FIG. 7 is an enlarged plan view of a boundary portion between an IGBT region 101a and a diode region 101b in a cell region (main electrode region 101) of the semiconductor device 100 according to the second preferred embodiment, and shows a configuration of a surface of a semiconductor substrate. Further, FIGS. 8 to 10 are cross-sectional views of the cell region of the semiconductor device 100 according to the second preferred embodiment, in which FIG. 8 corresponds to the cross section along line D1-D2 of FIG. 7, FIG. 9 corresponds to the cross section along line E1-E2 of FIG. 7, and FIG. 10 corresponds to the cross section along line F1-F2 of FIG. 7. Note that, in FIGS. 6 to 10, elements having functions similar to those of the elements shown in FIGS. 1 to 5 are denoted by the same reference numerals, and the detailed description thereof will be omitted here.

Also in the semiconductor device 100 of the second preferred embodiment, similarly to the first preferred embodiment, a part of a p type channel doped layer 2 reaches a front-side surface (contact part 13) of the semiconductor substrate and is connected to an emitter electrode 11. Further, in the contact part 13, a p$^+$ type diffusion layer 4 is interposed between the p type channel doped layer 2 and an n$^+$ type source layer 3, and the p type channel doped layer 2 and the n$^+$ type source layer 3 are not adjacent to each other.

In the second preferred embodiment, in the IGBT region 101a, a portion of the p type channel doped layer 2 connected to the emitter electrode 11 (portion reaching the contact part 13) is not formed in all the IGBT cells, but is formed exclusively in some of the IGBT cells. More specifically, in the IGBT region 101a, the portion of the p type channel doped layer 2 connected to the emitter electrode 11 is formed at least in the IGBT cell adjacent to the diode region 101b. In the example of FIGS. 7 to 10, the portion of the p type channel doped layer 2 connected to the emitter electrode 11 is formed exclusively in the IGBT cell adjacent to the diode region 101b.

Thus, even in the configuration in which the p type channel doped layer 2 is connected to the emitter electrode 11 exclusively in some of the IGBT cells, since an area of the p$^+$ type diffusion layer 4 in the IGBT region 101a is reduced, it is possible to obtain the effect of reducing operation of the parasitic diode and the recovery loss in diode operation, similarly to the first preferred embodiment. Further, in the contact part 13 of the IGBT region 101a, the p$^+$ type diffusion layer 4 having a high impurity concentration is arranged immediately next to the n$^+$ type source layer 3, and the p type channel doped layer 2 is configured not to be adjacent to the n$^+$ type source layer 3, so that it is possible to inhibit operation of the parasitic thyristor and to suppress reduction in the RBSOA tolerance in IGBT operation.

In the example of FIGS. 7 to 10, the portion of the p type channel doped layer 2 connected to the emitter electrode 11 is formed exclusively in one row of the IGBT cells adjacent to the diode region 101b, but may be formed in a plurality of rows of IGBT cells from a side close to the diode region 101b. A range in which the portion of the p type channel doped layer 2 connected to the emitter electrode 11 is arranged desirably includes a region having a same distance as a thickness of the semiconductor substrate or a distance about twice the thickness from a boundary between the IGBT region 101a and the diode region 101b toward the IGBT region 101a. By doing so, the above-mentioned range can cover the region where carriers spread when the semiconductor device 100 is energized, and operation of the parasitic diode can be effectively suppressed.

Further, with respect to a manufacturing method of a general reverse conducting IGBT, since the semiconductor device 100 of the second embodiment can also be formed by changing a pattern of a transfer mask for forming the n$^+$ type source layer 3 or the p$^+$ type diffusion layer 4, and it is not necessary to increase the number of manufacturing steps, the increase in manufacturing cost can be suppressed.

Third Preferred Embodiment

Figure 11:
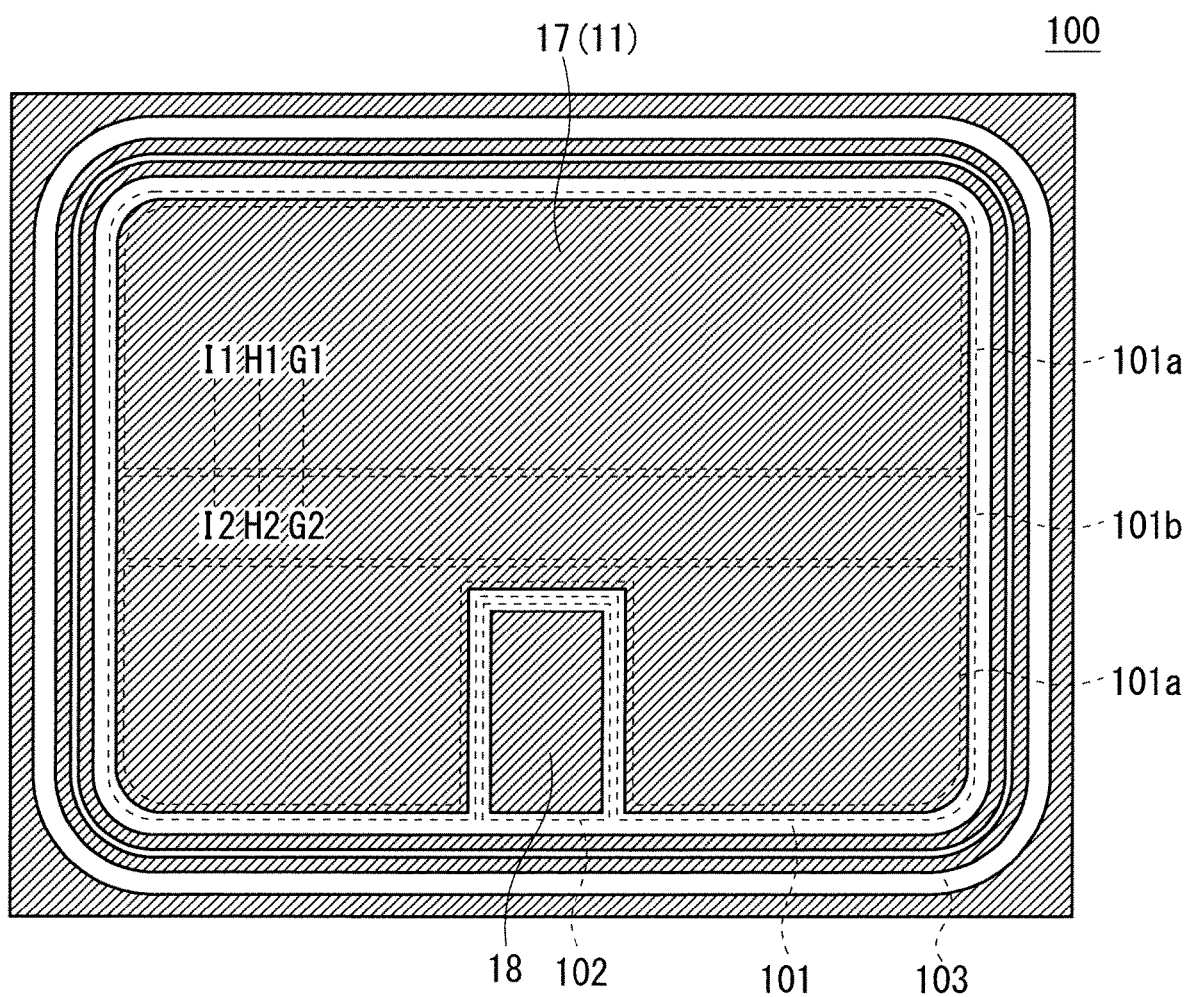
FIG. 11 is a plan view of a semiconductor device according to a third preferred embodiment.
Figure 12:
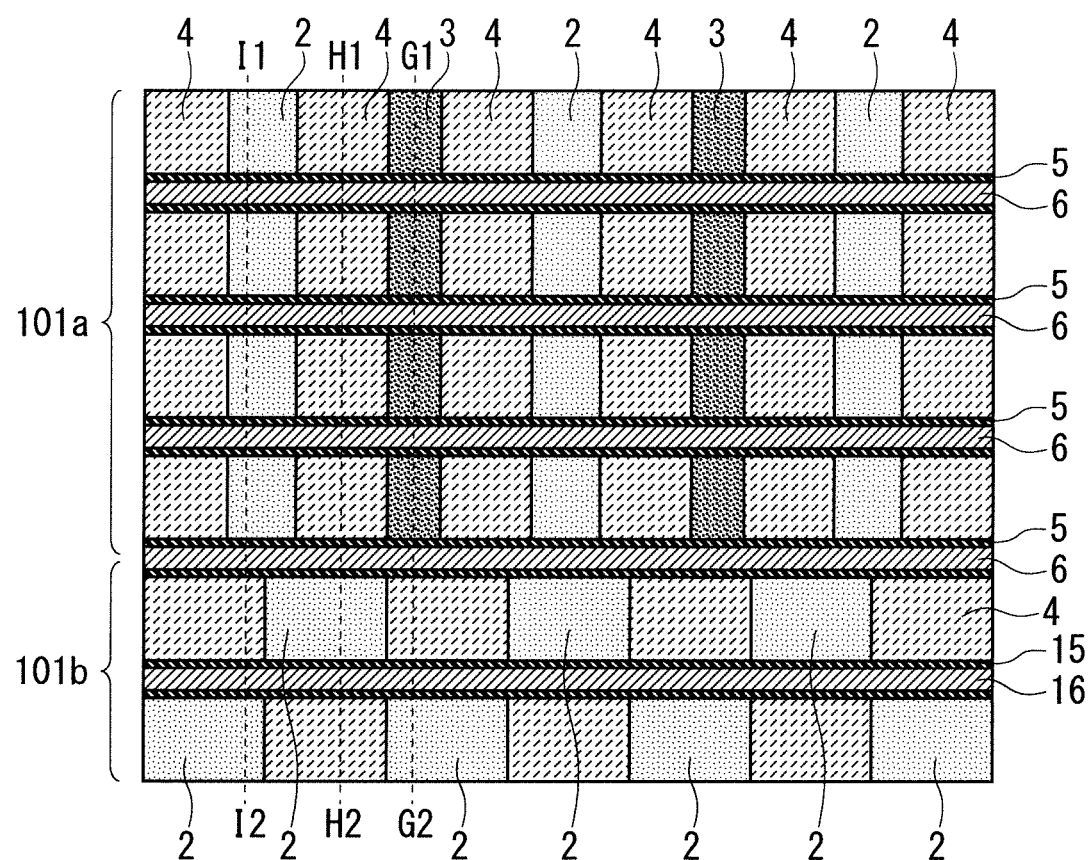
FIG. 12 is a plan view of a cell region of the semiconductor device according to the third preferred embodiment.
Figure 14:
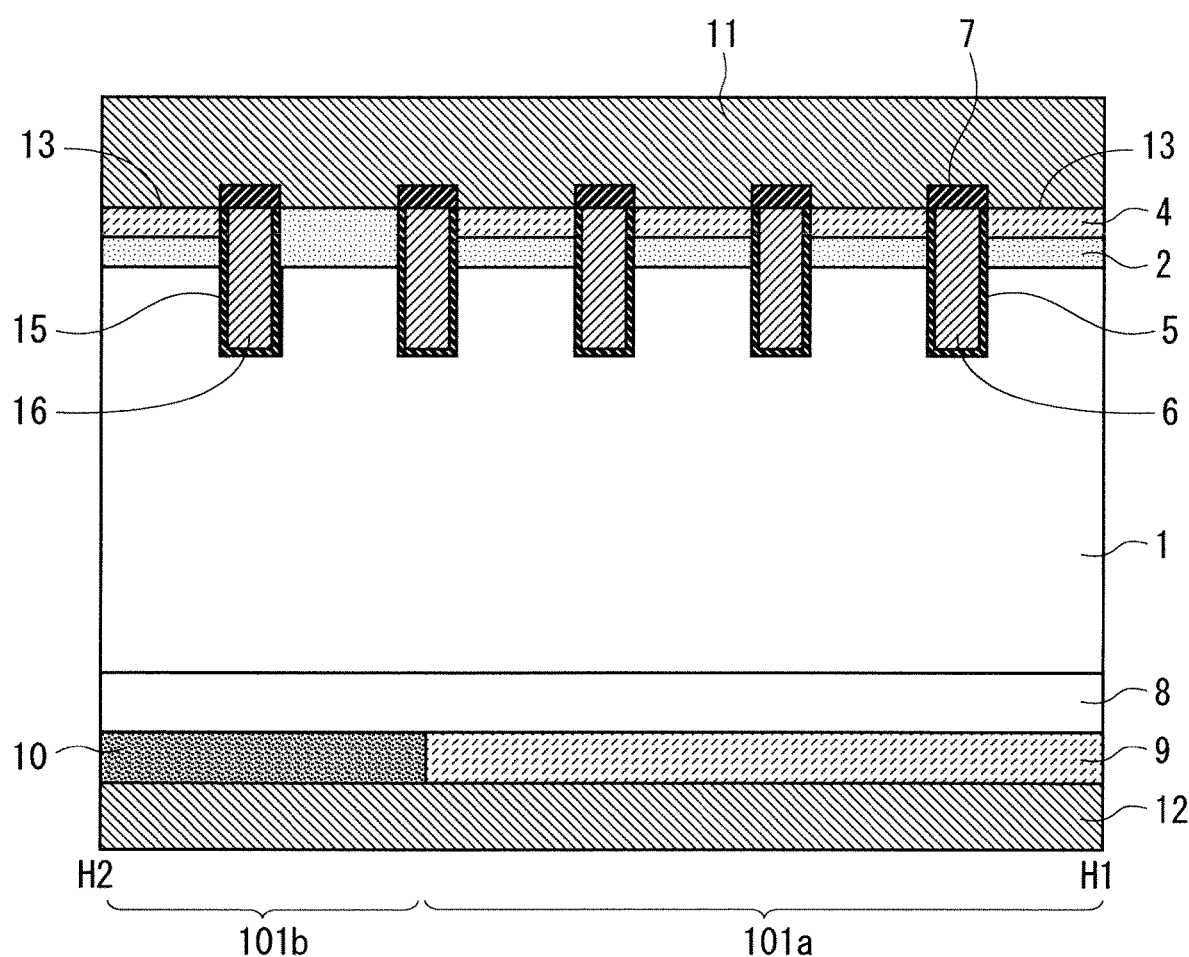

FIG. 11 is a plan view of a semiconductor chip of a reverse conducting IGBT, which is a semiconductor device 100 according to a third preferred embodiment. FIG. 12 is an enlarged plan view of a boundary portion between an IGBT region 101a and a diode region 101b in a cell region (main electrode region 101) of the semiconductor device 100 according to the third preferred embodiment, and shows a configuration of a surface of a semiconductor substrate. Further, FIGS. 13 to 15 are cross-sectional views of the cell region of the semiconductor device 100 according to the third preferred embodiment, in which FIG. 13 corresponds to the cross section along line G1-G2 of FIG. 12, FIG. 14 corresponds to the cross section along line H1-H2 of FIG. 12, and FIG. 15 corresponds to the cross section along line I1-I2 of FIG. 12. Note that, in FIGS. 11 to 15, elements having functions similar to those of the elements shown in FIGS. 1 to 5 are denoted by the same reference numerals, and the detailed description thereof will be omitted here.

Also in the semiconductor device 100 of the third preferred embodiment, similarly to the first preferred embodiment, a part of a p type channel doped layer 2 reaches a front-side surface (contact part 13) of the semiconductor substrate and is connected to an emitter electrode 11. Further, in the contact part 13, a $p^+$ type diffusion layer 4 is interposed between the p type channel doped layer 2 and an $n^+$ type source layer 3, and the p type channel doped layer 2 and the $n^+$ type source layer 3 are not adjacent to each other.

In the third preferred embodiment, also in the diode region 101b, there is provided a portion where the $p^+$ type diffusion layer 4 is not formed, and the p type channel doped layer 2 reaches a surface of the semiconductor substrate and is connected to the emitter electrode 11. In the example shown in FIGS. 12 to 15, the $p^+$ type diffusion layer 4 is formed in a checkered pattern (zigzag) in the diode region 101b, and the portion of the p type channel doped layer 2 connected to the emitter electrode 11 is also arranged in a checkered pattern.

According to the semiconductor device 100 of the third preferred embodiment, since the IGBT region 101a has a configuration similar to that of the first preferred embodiment, an effect similar to that of the first preferred embodiment can be obtained. Furthermore, in the diode region 101b, since the p type channel doped layer 2 is formed in a part of the contact part 13, a substantial impurity concentration in an anode region of the diode is lowered, and whereby the effect of reducing recovery loss in diode operation can be obtained.

In general, there is a trade-off relation between a forward drop voltage (Vf) and recovery loss (Err) in diode characteristics. It is effective to lower a p type impurity concentration of the anode in order to reduce the recovery loss, and it is effective to raise the p type impurity of the anode in order to reduce the forward voltage drop. Therefore, an area of a portion of the p type channel doped layer 2 connected to the emitter electrode 11 in the diode region 101b is desirably determined in accordance with the required characteristics of the diode.

Further, in the third preferred embodiment, the $p^+$ type diffusion layer 4 of the diode region 101b is arranged in a uniform checkerboard pattern. This is for a current flowing through the diode region 101b in diode operation to be two-dimensionally uniform as possible.

While applying this, for example, in the diode region 101b, by decreasing a density (area ratio) of the $p^+$ type diffusion layer 4 as closer to the IGBT region 101a (in other words, by increasing an area ratio of the portion of the p type channel doped layer 2 connected to the emitter electrode 11 as the region is closer to the IGBT region 101a), it is possible to reduce the substantial p type impurity concentration of the anode in the vicinity of the boundary between the IGBT region 101a and the diode region 101b. In such a configuration, a conductivity modulation at the boundary between the IGBT and the diode at the time of conduction is reduced, and the effect of reducing the parasitic operation of the IGBT to the diode can be obtained.

When a plurality of diode cells are provided in the diode region 101b as in the present preferred embodiment, the area ratio of the $p^+$ type diffusion layer 4 in the diode cell adjacent to the IGBT region 101a is desirably lower than the area ratio of the $p^+$ type diffusion layer 4 in the diode cell not adjacent to the IGBT region 101a.

Fourth Preferred Embodiment

Figure 17:
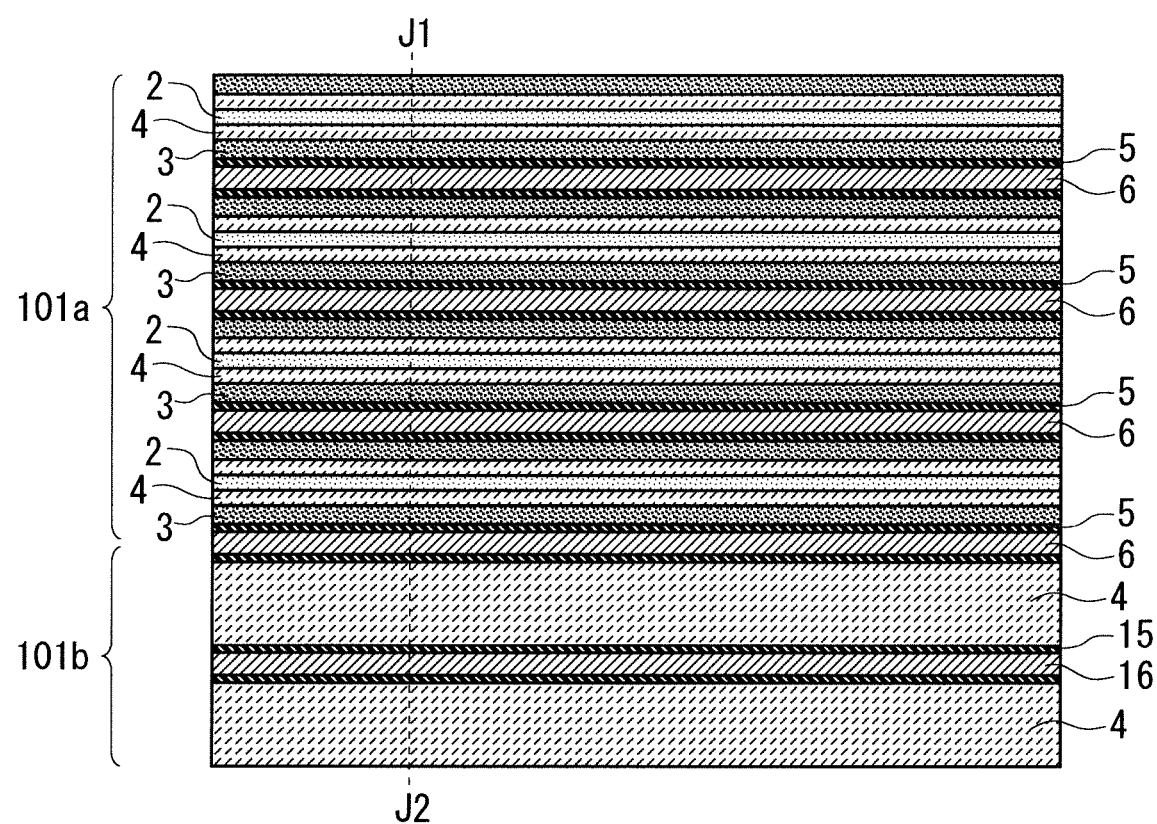
FIG. 17 is a plan view of a cell region of the semiconductor device according to the fourth preferred embodiment.

FIG. 16 is a plan view of a semiconductor chip of a reverse conducting IGBT, which is a semiconductor device 100 according to a fourth preferred embodiment. FIG. 17 is an enlarged plan view of a boundary portion between an IGBT region 101a and a diode region 101b in a cell region (main electrode region 101) of the semiconductor device 100 according to the fourth preferred embodiment, and shows a configuration of a surface of a semiconductor substrate. Further, FIG. 18 is a cross-sectional view of the cell region of the semiconductor device 100 according to the fourth preferred embodiment, and corresponds to the cross section along line J1-J2 of FIG. 17. Note that, in FIGS. 16 to 18, elements having functions similar to those of the elements shown in FIGS. 1 to 5 are denoted by the same reference numerals, and the detailed description thereof will be omitted here.

In the semiconductor device 100 of the fourth preferred embodiment, a plurality of IGBT cells are partitioned in a stripe shape in the IGBT region 101a. That is, an $n^+$ type source layer 3 extends along a trench in a gate electrode 6 in a stripe shape. Further, similarly to the first preferred embodiment, a part of a p type channel doped layer 2 reaches a front-side surface (contact part 13) of the semiconductor substrate and is connected to an emitter electrode 11. Further, in the contact part 13, a $p^+$ type diffusion layer 4 is interposed between the p type channel doped layer 2 and the $n^+$ type source layer 3, and the p type channel doped layer 2 and the $n^+$ type source layer 3 are not adjacent to each other. As a result, as shown in FIG. 17, on the front-side surface of the semiconductor substrate of the IGBT region 101a, since the portion of the p type channel doped layer 2 connected to the emitter electrode 11 is sandwiched by the $p^+$ type diffusion layers 4, the portion is to be adjacent to the $p^+$ type diffusion layer 4 alone.

Also in the semiconductor device 100 of the fourth preferred embodiment, since the p type channel doped layer 2, the $n^+$ type source layer 3, and the $p^+$ type diffusion layer 4 in the contact part 13 of the IGBT region 101a have the above features similar to those in the first preferred embodiment, an effect similar to that of the first preferred embodiment can be obtained.

Further, in the fourth preferred embodiment, the $p^+$ type diffusion layer 4 is formed deeper than the $n^+$ type source layer 3, and a part of the $p^+$ type diffusion layer 4 is extended until below the $n^+$ type source layer 3 at a portion where the $p^+$ type diffusion layer 4 and the $n^+$ type source layer 3 are adjacent to each other. With this configuration, since the p type impurity concentration is high immediately below the $n^+$ type source layer 3 in a region not affecting a MOS channel portion (a region separated from the gate insulating film 5), effects of suppressing operation of the parasitic thyristor, improving the controllable current, and expanding RBSOA can be obtained.

Moreover, also in the semiconductor device 100 according to other preferred embodiments, a similar effect can be obtained by forming the $p^+$ type diffusion layer 4 deeper than the $n^+$ type source layer 3, and extending a part of the $p^+$ type diffusion layer 4 until below the $n^+$ type source layer 3 in a region not affecting the MOS channel portion.

Fifth Preferred Embodiment

Figure 20:
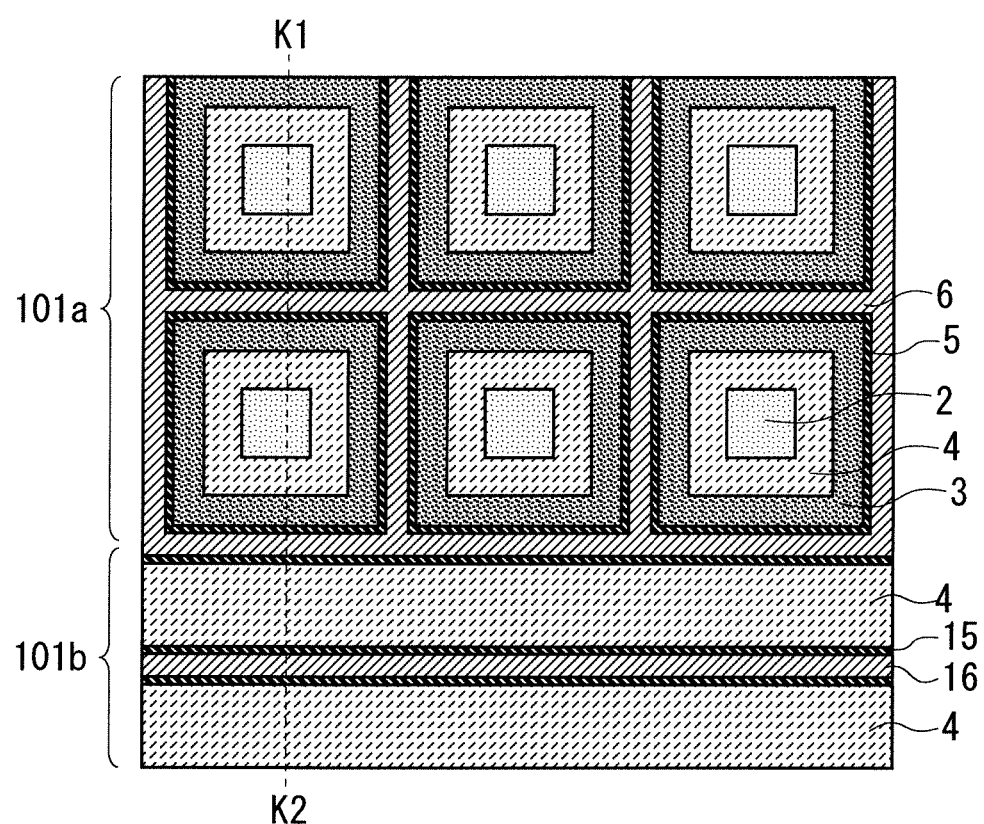
FIG. 20 is a plan view of a cell region of the semiconductor device according to the fifth preferred embodiment.

FIG. 19 is a plan view of a semiconductor chip of a reverse conducting IGBT, which is a semiconductor device 100 according to a fifth preferred embodiment. FIG. 20 is an enlarged plan view of a boundary portion between an IGBT region 101a and a diode region 101b in a cell region (main electrode region 101) of the semiconductor device 100 according to the fifth preferred embodiment, and shows a configuration of a surface of a semiconductor substrate. Further, FIG. 21 is a cross-sectional view of the cell region of the semiconductor device 100 according to the fifth preferred embodiment, and corresponds to the cross section along line K1-K2 of FIG. 20. Note that, in FIGS. 19 to 21, elements having functions similar to those of the elements shown in FIGS. 1 to 5 are denoted by the same reference numerals, and the detailed description thereof will be omitted here.

In the semiconductor device 100 of the fifth preferred embodiment, a plurality of IGBT cells are partitioned in a lattice shape in the IGBT region 101a. That is, an $n^+$ type source layer 3 is formed in a frame shape along a trench of a lattice-shaped gate electrode 6. Further, similarly to the first preferred embodiment, a part of a p type channel doped layer 2 reaches a front-side surface (contact part 13) of the semiconductor substrate and is connected to an emitter electrode 11. Further, in the contact part 13, a $p^+$ type diffusion layer 4 is interposed between the p type channel doped layer 2 and the $n^+$ type source layer 3, and the p type channel doped layer 2 and the $n^+$ type source layer 3 are not adjacent to each other. As a result, on a front-side surface of the semiconductor substrate, since the portion of the p type channel doped layer 2 connected to the emitter electrode 11 is located at the center of each IGBT cell and is surrounded by the $p^+$ type diffusion layer 4, the portion is to be adjacent exclusively to the $p^+$ type diffusion layer 4.

Also in the semiconductor device 100 of the fifth preferred embodiment, since the p type channel doped layer 2, the $n^+$ type source layer 3, and the $p^+$ type diffusion layer 4 in the contact part 13 of the IGBT region 101a have features similar to those in the first preferred embodiment, an effect similar to that of the first preferred embodiment can be obtained.

Sixth Preferred Embodiment

In a sixth preferred embodiment, in a diode region 101b of a semiconductor device 100, a damage layer for promoting recombination of excess carriers is provided on a $p^+$ type diffusion layer 4 to be an anode layer and an $n^-$ type drift layer 1 under a p type channel doped layer 2.

Figure 22:
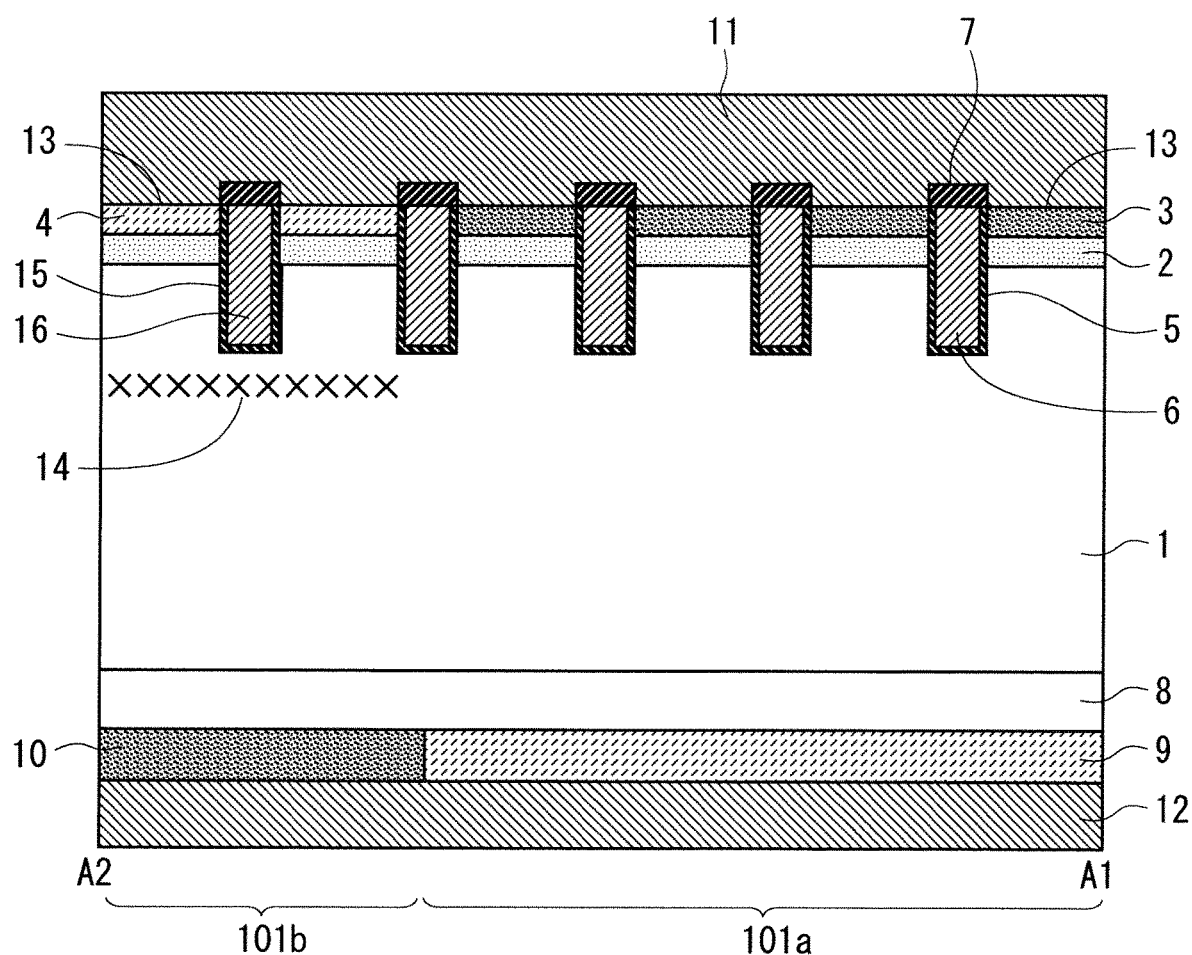
Figure 23:
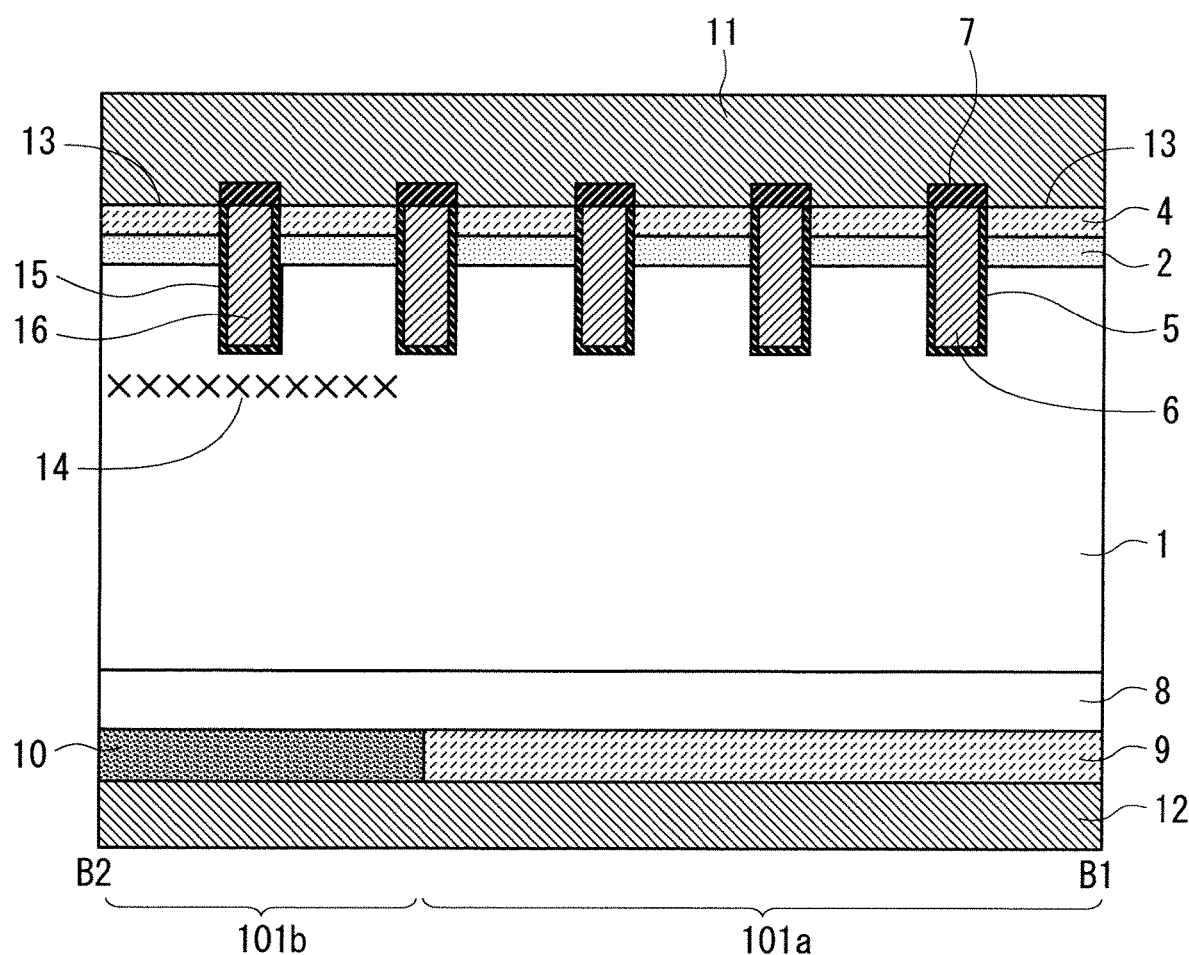

FIGS. 22 to 24 are cross-sectional views of a cell region of the semiconductor device 100 according to the sixth preferred embodiment. Here, an example is shown in which a damage layer 14 is formed in the diode region 101b of the semiconductor device 100 of the first preferred embodiment. That is, FIG. 22 corresponds to the cross section along line A1-A2 of FIG. 2, FIG. 23 corresponds to the cross section along line B1-B2 of FIG. 2, and FIG. 24 corresponds to the cross section along line C1-C2 of FIG. 2.

In the semiconductor device 100 of the sixth preferred embodiment, since an IGBT region 101a has a configuration similar to that of the first preferred embodiment, an effect similar to that of the first preferred embodiment can be obtained. Further, the damage layer 14 for promoting recombination of excess carriers is provided in the diode region 101b, and whereby the effect of reducing the recovery loss in diode operation can be enhanced.

Note that, if a current flowing from the IGBT region 101a not formed with the damage layer 14 is large, the effect of the damage layer 14 may be reduced. However, in the present preferred embodiment, an area of the $p^+$ type diffusion layer 4 formed in the IGBT region 101a is small since the p type channel doped layer 2 reaching the surface of the semiconductor substrate is formed in the IGBT region 101a. Therefore, the current from the IGBT region 101a is suppressed, and whereby the effect reduction of the damage layer 14 can be inhibited.

However, for manufacturing of the semiconductor device 100 according to the sixth preferred embodiment, a forming process of the damage layer 14 is required. The forming process of the damage layer 14 can be performed, for example, in the following procedure.

First, after covering a region other than the diode region 101b, and covering the semiconductor substrate with a mask (for example, a metal mask or the like) having a certain thickness in which a formation region of the damage layer 14 is opened, charged particles such as protons (H+) are irradiated. As a result, it is possible to form a crystal defect layer at a specific depth of the diode region 101b while suppressing introduction of charged particles into the IGBT region 101a. Thereafter, heat treatment is performed on the semiconductor substrate to form the damage layer 14 in which an amount of recombination is adjusted so as to obtain desired electrical characteristics.

In the present preferred embodiment, an example is shown in which the damage layer 14 is locally formed at a depth near the anode layer (the $p^+$ type diffusion layer 4 and the p type channel doped layer 2), but it is also possible to form the damage layer 14 over the entire diode region 101b. The depth at which the damage layer 14 is formed can be determined in accordance with energy of the charged particles, and may be adjusted in accordance with the desired characteristics.

Here, although the structure in which the damage layer 14 is provided in the semiconductor device 100 of the first preferred embodiment has been shown, but the damage layer 14 of the sixth preferred embodiment is also applicable to the semiconductor device 100 other than the first preferred embodiment.

Seventh Preferred Embodiment

In a seventh preferred embodiment, a buried electrode 16 provided in a diode region 101b of a semiconductor device 100 is connected to an emitter electrode 11.

Figure 25:
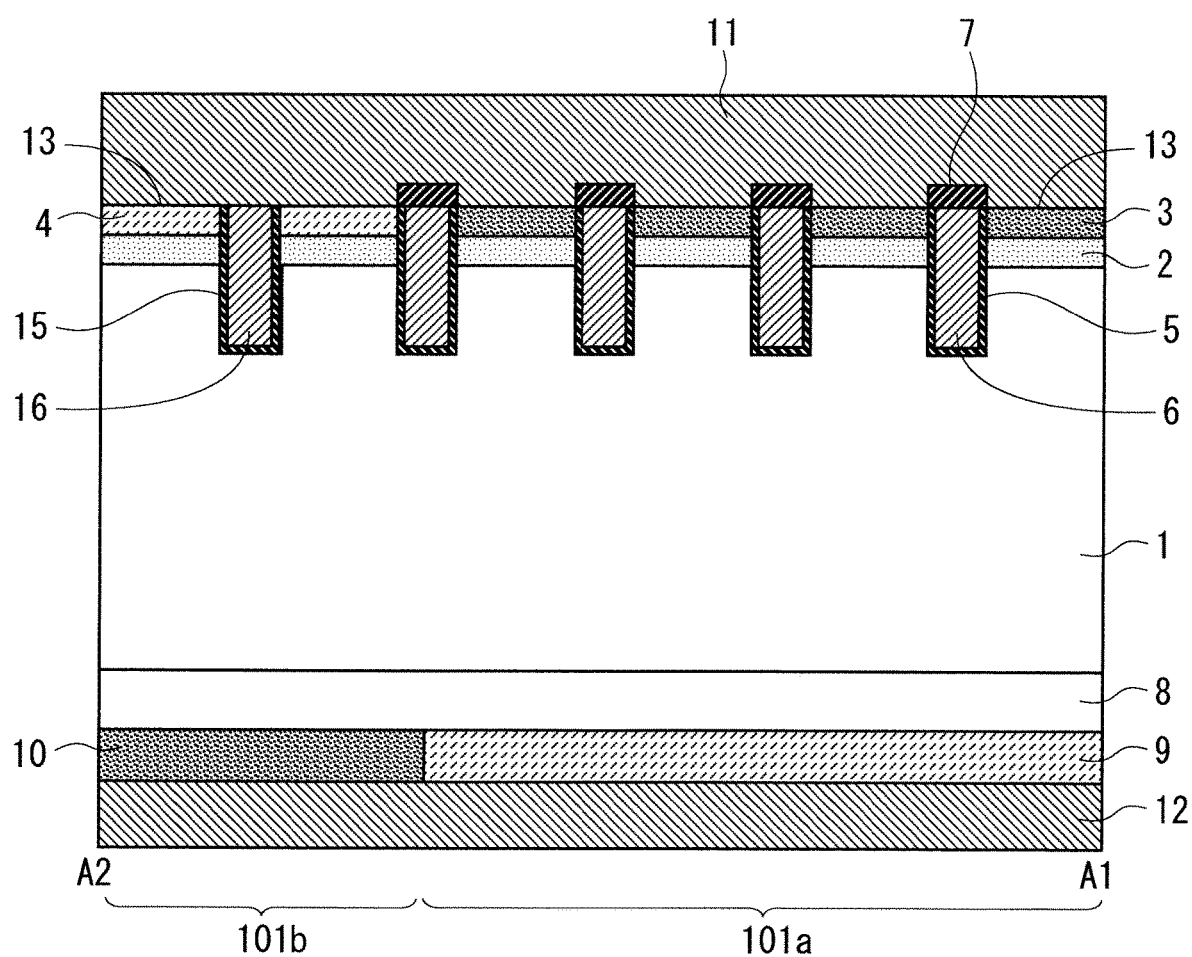
Figure 26:
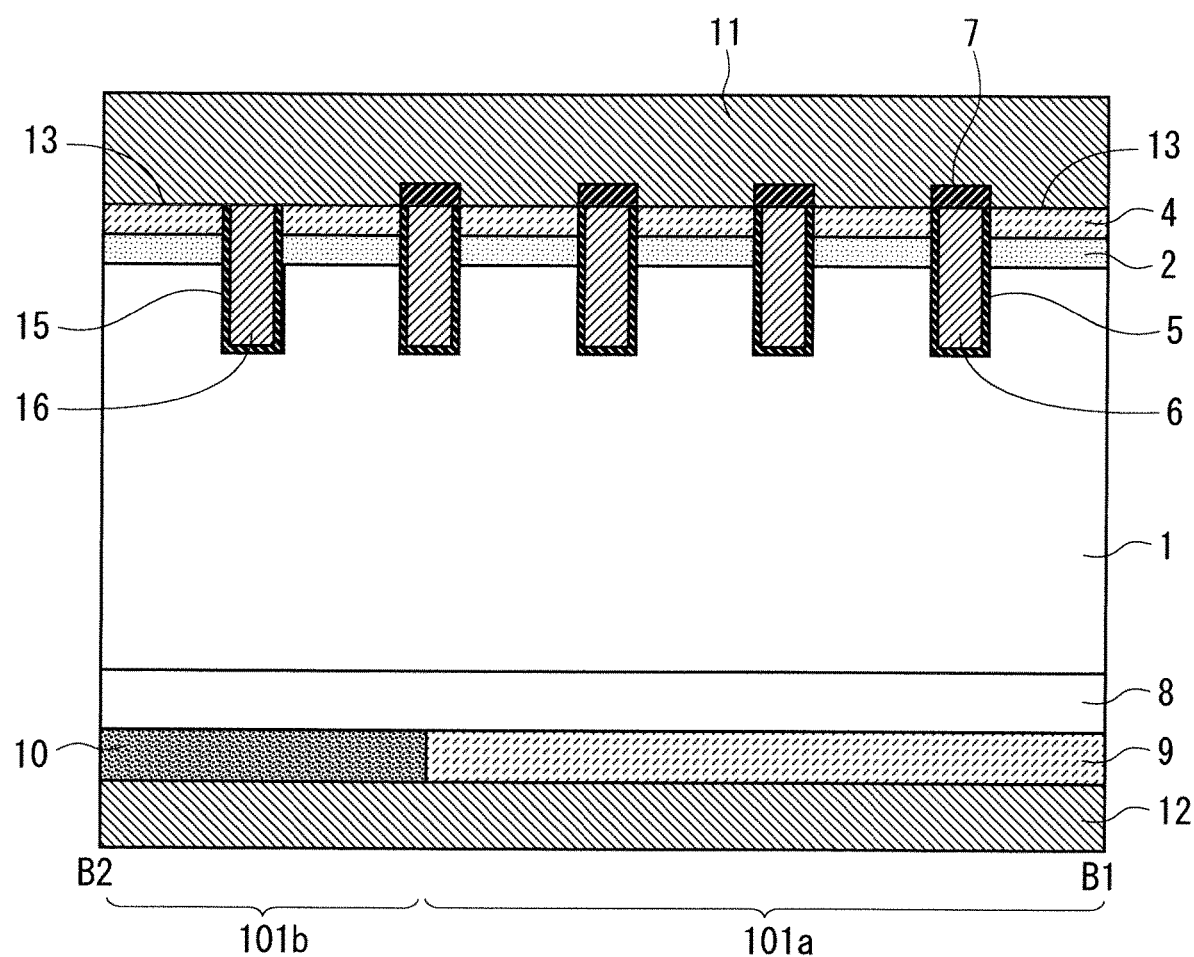

FIGS. 25 to 27 are cross-sectional views of a cell region of the semiconductor device 100 according to the seventh preferred embodiment. Here, an example is shown in which, with respect to the semiconductor device 100 of the first preferred embodiment, a cap insulating film 7 on a buried insulating film 15 of the diode region 101b is omitted, and the buried insulating film 15 is connected to the emitter electrode 11. That is, FIG. 25 corresponds to the cross section along line A1-A2 of FIG. 2, FIG. 26 corresponds to the cross section along line B1-B2 of FIG. 2, and FIG. 27 corresponds to the cross section along line C1-C2 of FIG. 2.

In the semiconductor device 100 of the sixth preferred embodiment, since an IGBT region 101a has a configuration similar to that of the first preferred embodiment, an effect similar to that of the first preferred embodiment can be obtained. Further, by fixing the buried insulating film 15 of the diode region 101b to an emitter potential, a gate capacitance of the entire semiconductor chip is lowered, and recovery loss in diode operation can be reduced.

Further, with respect to the manufacturing method of the first preferred embodiment, in the sixth preferred embodiment, it is sufficient to exclusively change a pattern of a trench in which the buried insulating film 15 and the buried electrode 16 are formed and a pattern of the cap insulating film 7, so that it is not necessary to add a manufacturing process.

Here, a configuration is shown in which the buried insulating film 15 is connected to the emitter electrode 11 in the semiconductor device 100 of the first preferred embodiment. However, the seventh preferred embodiment is also applicable to a semiconductor device 100 other than the first preferred embodiment.

Modification

In each preferred embodiment above, the first conductivity type is the p type and the second conductivity type is the n type. However, in reverse, the first conductivity type may be the n type and the second conductivity type may be the p type.

In each preferred embodiment, the reverse conducting IGBT including the IGBT and the diode is shown as an example of the semiconductor device, but the semiconductor device may be, for example, a switching element having a diode structure therein, such as a MOSFET. Further, the structure of the gate electrode is not limited to the trench type, and may be a flat type (planar type).

Furthermore, even in a structure in which an n type carrier storage layer having an impurity concentration higher than that of the n⁻ type drift layer 1 is formed immediately below the p type channel doped layer 2, it is possible to obtain an effect similar to that of each preferred embodiment described so far.

Furthermore, materials of the semiconductor substrate, the insulating film (the gate insulating film 5 and the cap insulating film 7), and the electrode (the emitter electrode 11 and the collector electrode 12) are not limited to those exemplified above. For example, the material of the semiconductor substrate may be a wide band gap semiconductor such as SiC, a gallium nitride based material, or diamond. Further, the electrode can also be configured by combining a plurality of materials.

It should be noted that the present invention can freely combine each preferred embodiment within the scope of the invention, and can deform or omit each preferred embodiment as appropriate.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
a switching element having
a channel doped layer of a first conductivity type formed in a surface layer part on a front side of a semiconductor substrate,
a first diffusion layer of a first conductivity type selectively formed in a surface layer part of the channel doped layer and having a higher impurity concentration than that of the channel doped layer,
a source layer of a second conductivity type selectively formed in a surface layer part of the channel doped layer, and
an electrode formed on a front-side surface of the semiconductor substrate and connected to the source layer and the first diffusion layer; and
a diode formed between the first diffusion layer and a second diffusion layer of a second conductivity type formed in a surface layer part on a back side of the semiconductor substrate,
wherein
a part of the channel doped layer reaches a front-side surface of the semiconductor substrate and is connected to the electrode, and
on a front-side surface of the semiconductor substrate, the first diffusion layer is interposed between the channel doped layer and the source layer, and there is not a portion where the channel doped layer and the source layer are adjacent to each other.

2. The semiconductor device according to claim 1, wherein
on a front-side surface of the semiconductor substrate, the first diffusion layer between the channel doped layer and the source layer is a portion where an impurity concentration of a first conductivity type is highest.

3. The semiconductor device according to claim 1, wherein
the first diffusion layer is formed deeper than the source layer, and the first diffusion layer extends until below the source layer at a portion adjacent to the source layer.

4. The semiconductor device according to claim 1, wherein
the switching element is an IGBT including a collector layer of a first conductivity type formed in a surface layer part on a back side of the semiconductor substrate.

5. The semiconductor device according to claim 4, wherein
in the semiconductor substrate, an IGBT region formed with the IGBT and a diode region formed with the diode are arranged to be segmented from each other in plan view, and
a portion of the channel doped layer connected to the electrode is formed at least in the IGBT region.

6. The semiconductor device according to claim 5, wherein
in the IGBT region, cells of a plurality of the IGBTs are partitioned in a stripe shape, and
on a front-side surface of the semiconductor substrate of the IGBT region, a portion of the channel doped layer connected to the electrode is adjacent exclusively to the first diffusion layer.

7. The semiconductor device according to claim 5, wherein
in the IGBT region, cells of a plurality of the IGBTs are partitioned in a lattice shape, and
on a front-side surface of the semiconductor substrate of the IGBT region, a portion of the channel doped layer connected to the electrode is adjacent exclusively to the first diffusion layer.

8. The semiconductor device according to claim 5, wherein
a portion of the channel doped layer connected to the electrode is formed at least in a cell of the IGBT adjacent to the diode region.

9. The semiconductor device according to claim 5, wherein
also in the diode region, a part of the channel doped layer reaches a front-side surface of the semiconductor substrate and is connected to the electrode.

10. The semiconductor device according to claim 9, wherein in the diode region, an area ratio of a portion of the channel doped layer connected to the electrode is increased as a region is closer to the IGBT region.

11. The semiconductor device according to claim 5, further comprising
   a drift layer of a second conductivity type formed under the channel doped layer of the IGBT region and the diode region; and
   a damage layer formed on the drift layer of the diode region.

* * * * *